United States Patent [19]

Koshimura et al.

[11] Patent Number: 5,736,298
[45] Date of Patent: Apr. 7, 1998

[54] WATER DEVELOPABLE PHOTOSENSITIVE RESIN COMPOSITION

[75] Inventors: Katsuo Koshimura, Yokkaichi, Japan; Takayoshi Tanabe, Bowling Green, Ohio; Hozumi Sato, Yokkaichi, Japan; Noboru Ohshima, Suzuka, Japan; Takashi Nishioka, Yokkaichi, Japan

[73] Assignee: Japan Synthetic Rubber Co., Ltd., Tokyo, Japan

[21] Appl. No.: 536,494

[22] Filed: Oct. 2, 1995

Related U.S. Application Data

[63] Continuation of Ser. No. 130,835, Oct. 4, 1993, abandoned.

[30] Foreign Application Priority Data

Oct. 2, 1992 [JP] Japan ................... 4-287165

[51] Int. Cl.$^6$ ........................................ G03C 1/73
[52] U.S. Cl. ........................ 430/287.1; 430/281.1; 430/284.1; 522/96
[58] Field of Search ................ 430/280.1, 281.1, 430/284.1, 286.1, 287.1, 288.1; 522/96

[56] References Cited

U.S. PATENT DOCUMENTS

| | | | |
|---|---|---|---|
| 4,198,238 | 4/1980 | Scheve | 430/286 |
| 4,806,450 | 2/1989 | Hofmann et al. | 430/286 |
| 5,073,477 | 12/1991 | Kusuda et al. | 430/287 |
| 5,175,076 | 12/1992 | Ishikawa et al. | 430/281 |
| 5,336,585 | 8/1994 | Takahashi et al. | 430/284.1 |

FOREIGN PATENT DOCUMENTS

| | | |
|---|---|---|
| 0 164 270 | 5/1990 | European Pat. Off. |
| 58-208742 | 12/1983 | Japan. |
| 60-179411 | 9/1985 | Japan. |
| 60-219208 | 11/1985 | Japan. |
| 61-181811 | 8/1986 | Japan. |
| 61-228002 | 10/1986 | Japan. |
| 61-246742 | 11/1986 | Japan. |
| 62-84113 | 4/1987 | Japan. |
| 63-162712 | 7/1988 | Japan. |
| 63-220240 | 9/1988 | Japan. |
| 1-300246 | 12/1989 | Japan. |
| 1-183651 | 7/1990 | Japan. |

*Primary Examiner*—George F. Lesmes
*Assistant Examiner*—Laura Weiner
*Attorney, Agent, or Firm*—Oblon, Spivak, McClelland, Maier & Neustadt, P.C.

[57] ABSTRACT

A photo-sensitive resin composition is provided which contains (1) a particulate polymer of a carboxy-group-containing-diene having a cross-linked structure; (2) a polymer having two or more photo-polymerizable unsaturated groups at its molecular chain terminals, and, optionally, a photo-polymerizable unsaturated group, carboxyl group, hydroxy group, amino group, or epoxy group in side chains, or (2') a non-diene-type polymer having a photo-polymerizable unsaturated group, carboxyl group, hydroxy group, amino group, or epoxy group in side chains, or a low molecular weight linear diene-type polymer; (3) a photo-polymerizable unsaturated monomer; (4) a polymer containing an amino group; and (5) a photo-polymerization initiator. The photo-sensitive resin composition has excellent water-developing capability and shows almost no swelling in water, causing minimal reduction in strength and only minimal dimensional changes during development. Resin plates prepared from the composition possess excellent strength after exposure to light, excellent elongation at break, impact resilience and superb transparency, providing a good characteristic balance of properties.

10 Claims, No Drawings

WATER DEVELOPABLE PHOTOSENSITIVE RESIN COMPOSITION

This application is a Continuation of application Ser. No. 08/130,835, filed on Oct. 4, 1993, now abandoned.

BACKGROUND OF THE INVENTION

1. Field of the Invention

The present invention relates to a novel photo-sensitive resin composition which can be developed in an aqueous system (hereinafter referred to as a water-developable photo-sensitive resin composition), and, more particularly, to a water-developable photo-sensitive resin composition which shows almost no swelling in water and which exhibits minimal reduction in strength and only minimal dimensional changes during development.

2. Description of the Background Art

Conventionally, a wide variety of photo-sensitive resin compositions have been used in fields such as photoresist, book and printing ink manufacture.

Compositions containing photo-sensitive resins as major components are known in the art as photo-sensitive resin compositions. Such photo-sensitive resin compositions include compositions containing cyclized rubber and a bisazide compound; compositions containing a thermoplastic elastomer, an acrylic monomer, and a photo-polymerization initiator; compositions containing polyester acrylate, epoxy acrylate, poly(vinyl cinnamic acid), chloromethylated polystyrene, and resins containing aromatic azide groups. Because all these photo-sensitive resin compositions are insoluble in water, organic solvents are used when they are developed. In recent years, however, the use of organic solvents poses problems from the aspect of safety during processing, their influence on the health of workers and environment, and the like. Although photo-sensitive resin compositions are known which use an alkali in the development process to avoid the use of organic solvents, such as novolac resin or polyvinylphenol and a quinone azide compound, there nevertheless, still exists a need for photo-sensitive resin compositions which can be developed in water, which are even safer and which use more readily available materials.

Compositions comprising a water-soluble resin as a base resin have been proposed as water-developable photo-sensitive resin compositions. Such compositions include a composition comprising a water-soluble resin (such as polyvinyl alcohol, gelatin, or casein) and a bicromate, a diazonium salt, a bisazide or similar compounds and a composition comprising a water-soluble resin, a water-soluble acrylic monomer, and a photo-polymerization initiator. However, because these base resins possess too great an affinity for water, such resin compositions tend to suffer a reduction in strength and a change in size due to swelling during development. As a result, not only may the dimensional precision accuracy of the resists be reduced, but other performance characteristics such as the printing performances of the printing press and printing quality may be impaired.

In an attempt to solve these problems involved in water-developable photo-sensitive resin compositions, the present inventors have previously proposed a photo-sensitive resin composition which comprises a copolymer soluble in an aqueous alkaline solution. This composition comprises a conjugated diene compound or an acrylic ester compound, an α,β-ethylenically unsaturated carboxylic acid, and a polyfunctional vinyl compound; a photo-polymerizable unsaturated monomer; a compound containing an amino group; and a photo-polymerization initiator (Japanese Patent Laid-open Nos. 179411/1985, 219208/1985, 181811/1986). Other water-developable photo-sensitive resin compositions known in the art include a composition comprising an aliphatic conjugated diene compound, a partial cross-linked copolymer of an α,β-ethylenically unsaturated carboxylic acid and a polyfunctional vinyl compound, an aliphatic conjugated diene polymer having a molecular weight of 5,000 or greater, a photo-polymerizable unsaturated monomer, a compound containing a basic nitrogen, and a photo-polymerization initiator (Japanese Patent Laid-open No. 300246/1989); a composition comprising a polymer having a tertiary amino group and a polymerizable unsaturated group, α,β-ethylenically unsaturated monomer having a free acidic group, a photo-polymerizable unsaturated monomer, and a photo-polymerization initiator (Japanese Patent Laid-open No. 246742/1986); and a composition comprising a photo-polymerizable unsaturated monomer, a compound containing an amino group, and an aromatic ketone compound, wherein at least a part of the photo-polymerizable unsaturated monomer and the compound containing an amino group possesses a (meth)acryloyl group (Japanese Patent Laid-open No. 228002/1986).

These photo-sensitive resin compositions, however, are not satisfactory from the point of view of the balance of their characteristics, including their development ability in an aqueous medium, curability by radiation and strength after development.

SUMMARY OF THE INVENTION

Accordingly one object of the present invention is to provide a novel photo-sensitive resin composition which has excellent aqueous developing capability, which shows almost no swelling in water, exhibits minimal reduction in its strength and which results in only minor dimensional changes. Preferred photosensitive resins would be those capable of producing resin plates having excellent strength after exposure to light, and would possess superior elongation, transparency, and a superb balance of characteristics.

The above object of the present invention has now been achieved by the discovery of a photo-sensitive resin composition comprising, (1) 100 parts by weight of a particulate polymer of a carboxy-group-containing-diene having a cross-linked structure and an average particle diameter of from 20 to 1000 nm, prepared by emulsion or suspension polymerization of a monomer mixture comprising (i) 10–95 mol % of at least one aliphatic conjugated diene monomer, (ii) 0.1–30 mol % of at least one unsaturated monomer containing a carboxyl group, (iii) 0.01–20 mol % of at least one monomer containing at least two polymerizable unsaturated groups, and (iv) 0–70 mol % of at least one other copolymerizable monomer, provided that the total of (i), (ii), (iii), and (iv) is 100 mol %, (2) 0.1–30 parts by weight of a non-cross-linked polymer having at least one functional group selected from the group consisting of photo-polymerizable unsaturated groups, carboxyl group, hydroxy group, amino group, and epoxy group and having a number average molecular weight of 2,000–5,000 (In defining the functional group, it is intended that polymers having such functional groups as carboxyl groups, hydroxy groups, amino groups, or epoxy groups at the chain terminals are excluded, unless they have a functional group in the side chain of the type of a photo-polymerizable unsaturated group, a carboxyl group, a hydroxy group, an amino group, or an epoxy group), (3) 5–1,000 parts by weight of a photo-polymerizable unsaturated monomer, (4) a compound containing an amino group in an amount of 0.1–5 mol per 1 mol of the carboxyl group contained in said polymer (1), and (5) 0.1–20 parts by weight of a photo-polymerization initiator.

In a preferred embodiment of the photo-sensitive resin composition of the present invention, the polymer (2) is (2-1) a non-cross-linked polymer having two or more photo-polymerizable unsaturated groups at its molecular chain terminals (such a composition is hereafter referred to as the first composition).

It is particularly preferred that the non-cross-linked polymer (2-1) is a diene-type polymer or a polyetherdiol having a (meth)acryloyl group bound at both terminals of the molecular chain via a urethane bond.

In another preferred embodiment of the photo-sensitive resin composition the present invention, the polymer (2) is (2-2) a non-cross-linked polymer having two or more photo-polymerizable unsaturated groups at its molecular chain terminals and at least one functional group of the type of a photo-polymerizable unsaturated group, a carboxyl group, a hydroxy group, an amino group, or an epoxy group in the side chains (such a composition is hereafter referred to as the second composition).

It is particularly preferred that the non-cross-linked polymer (2-2) is a polymer produced by addition polymerization wherein a compound having at least one of the above functional groups is introduced into a diene-type polymer having a (meth)acryloyl group at both terminals of the molecular chain, bound via a urethane bond.

In still another preferred embodiment of the photo-sensitive resin composition of the present invention, the polymer (2) is (2-3) a non-diene-type polymer having at least one functional group of the type of a photo-polymerizable unsaturated group, a carboxyl group, a hydroxy group, an amino group or an epoxy group in the side chains (such a composition is hereafter referred to as the third composition).

It is also particularly preferred that the non-cross-linked polymer (2-3) be a polymer which was prepared by the polymerization of at least two monomers selected from the group consisting of (meth)acrylic acid alkyl esters, unsaturated monomers containing a carboxyl group, unsaturated monomers containing a hydroxy group, unsaturated monomers containing an amino group, and unsaturated monomers containing an epoxy group, and this polymer may further contain a (meth)acryloyl group or a cinnamoyl group, or both, bonded to the side chains via a urethane bond.

In a further preferred embodiment of the photo-sensitive resin composition the present invention, the polymer (2) is (2-4) a diene-type polymer having at least one functional group of the type of a photo-polymerizable unsaturated group, a carboxyl group, a hydroxy group, an amino group, or an epoxy group in the side chains (such a composition is hereafter referred to as the fourth composition).

It is also particularly preferred that the diene-type polymer (2-4) be a polymer prepared by polymerization of a monomer mixture comprising butadiene or isoprene, or both, and at least one monomer selected from the group consisting of (meth)acrylic acid alkyl esters, unsaturated monomers containing carboxyl group, unsaturated monomers containing hydroxy group, unsaturated monomers containing amino group, and unsaturated monomers containing epoxy group, and this polymer may further comprise a (meth)acryloyl group or a cinnamoyl group, or both, bonded to the side chains via a urethane bond.

Other objects, features and advantages of the invention will hereinafter become more readily apparent from the following detailed description.

DETAILED DESCRIPTION OF THE INVENTION AND PREFERRED EMBODIMENTS

Component (1)

The polymer of a carboxy-group-containing-diene having a cross-linked structure and in the form of particles (hereafter referred to as component (1)), used in some of the compositions of the present invention, comprises particles of at least one polymer of a diene containing a carboxyl group, which comprises recurring units of an aliphatic conjugated diene, as an essential component, and has a cross-linked structure.

A preferred polymer of component (1) is a particulate polymer prepared by emulsion polymerization of a monomer mixture which comprises, (i) 10–95 mol % of at least one aliphatic conjugated diene monomer selected from the group consisting of 1,3-butadiene and isoprene, (ii) 0.1–30 mol % of at least one unsaturated monomer containing a carboxyl group selected from the group consisting of acrylic acid, methacrylic acid, crotonic acid, cinnamic acid, itaconic acid, maleic acid, and the mono-ester of 2-hydroxyethyl (meth)acrylate and phthalic acid or succinic acid, (iii) 0.01–20 mol % of at least one monomer containing at least two unsaturated groups selected from the group consisting of ethylene glycol di(meth)acrylate, propylene glycol di(meth)acrylate, divinylbenzene, hexanediol di(meth)acrylate, pentaerythritol tri(meth)acrylate, pentaerythritol tetra(meth)acrylate, and trimethylolpropane tri(meth)acrylate, and (iv) 0–70 mol % of at least one other copolymerizable monomer selected from the group consisting of aromatic vinyl monomers, unsaturated nitriles, (meth) acrylic acid alkyl esters, methoxy dialkylene glycol monoacrylate, and more particularly, selected from the group consisting of styrene, acrylonitrile, methyl (meth)acrylate, ethyl (meth)acrylate, 2-ethylhexyl (meth)acrylate, methoxyethyl acrylate, methoxy diethylene glycol monoacrylate, methoxy dipropylene glycol monoacrylate, and lauryl (meth)acrylate, provided that the total of (i), (ii), (iii), and (iv) is 100 mol %.

The cross-linked structure in component (1) can be attained when the polymer of a carboxyl-group-containing diene is produced or cross-linking may occur after the polymer has been formed. Further, the cross-linked structure may be introduced both during and after the production of the polymer of a carboxyl-group-containing diene. It is desirable that at least a portion of the cross-linked structure be introduced when the polymer of carboxyl-group-containing diene is being produced.

The component (1) can be obtained as polymer particles when the polymer of a diene containing the carboxyl group is manufactured by a process such as emulsion, suspension or precipitation polymerization. Alternatively, the polymer can be first prepared then pulverized into particles. Further, the polymer particles may be obtained from a solution of the polymer.

It is preferred that the polymer particles of component (1) be manufactured by emulsion or suspension polymerization using a free radical polymerization initiator, or by a combination of emulsion and suspension polymerization. Emulsion polymerization is especially preferred in order to prepare particles with the desired uniform particle size. The average particle diameter of component (1) is preferably 20–1,000 nm, more preferably 30–950 nm, most preferably 40–900 nm.

Polymer component (1) can be manufactured, for example, by the following methods:

Method (P-1): Copolymerizing an aliphatic conjugated diene (i), an unsaturated monomer containing a carboxyl group (ii), a monomer containing at least two polymerizable unsaturated groups (iii), and, optionally, other monomers (iv).

Method (P-2): Copolymerizing an aliphatic conjugated diene (i) and a monomer containing at least two polymerizable unsaturated groups (iii), optionally, together with other monomers (iv), and carboxylating the resulting copolymer. Such a carboxylating treatment may be performed by an addition reaction of an unsaturated carboxylic acid or an unsaturated carboxylic acid anhydride (such as maleic acid or maleic acid anhydride), and subsequent hydrolysis which follows as needed.

Method (P-1) is particularly preferred.

Suitable aliphated conjugated dienes include butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichloro-butadiene and 1,3-cyclopentadiene, with butadiene and isoprene being preferred.

The aliphatic conjugated dienes (i) may be used either individually or as a mixture of two or more of them together.

Suitable unsaturated monomers containing a carboxyl group (ii) include unsaturated mono-carboxylic acids, such as (meth)acrylic acid, crotonic acid and cinnamic acid; unsaturated polycarboxylic acids or unsaturated polycarboxylic acid anhydrides, such as maleic acid, maleic acid anhydride, fumaric acid, itaconic acid, itaconic acid anhydride, citoraconic acid and mesaconic acid; esters containing a free carboxylic acid group, such as monomethyl esters, monoethyl esters, or monopropyl esters of the above unsaturated polycarboxylic acids; nitriles containing a free carboxylic acid group, such as mononitriles of the above unsaturated polycarboxylic acids; amides containing a free carboxylic acid group, such as monoamides of the above unsaturated polycarboxylic acids; hydroxyalkyl esters containing a free carboxylic acid group, such as mono(2-hydroxyethyl esters) or mono(2-hydroxypropyl esters) of the above unsaturated polycarboxylic acids; N-hydroxyalkyl amide derivatives containing a free carboxylic acid group, such as N-hydroxyalkylamides of the above unsaturated polycarboxylic acids; and esters containing a free carboxylic acid group prepared from a non-polymerizable polycarboxylic acid (such as citric acid, adipic acid or phthalic acid) and a compound containing a hydroxy group (such as an unsaturated alcohol or 2-hydroxyethyl(meth)acrylate).

Preferred unsaturated monomers containing a carboxyl group (ii) are (meth)acrylic acid, monovinyl citrate, monoester of citric acid and 2-hydroxyethyl-(meth)acrylate, and monoester of phthalic acid and 2-hydroxyethyl(meth) acrylate.

These aliphatic unsaturated monomers containing a carboxyl group (ii) may be used either individually or as a mixture of two or more of them together.

Suitable compounds containing at least two polymerizable unsaturated groups (iii) include di(meth)acrylates of alkylene glycols, such as ethylene glycol, propylene glycol, 1,4-butanediol, 1,5-pentanediol, or 1,6-hexanediol; di(meth)acrylates of poly $C_2$–$C_{20}$ alkylene glycol, such as polyethylene glycol or polypropylene glycol; di(meth)acrylates of a polymer having hydroxy groups at both terminals of the molecular chain, such as polybutadiene having hydroxy groups at both terminals, polyisoprene having hydroxy groups at both terminals, butadiene-acrylonitrile copolymer having hydroxy groups at both terminals or polycaprolactone having hydroxy groups at both terminals; poly(meth) acrylates of a polyhydric (tri or more) alcohol, such as glycerine, 1,2,4-butanetriol, a trimethylol alkane (with the alkane having, for example, 1–3 carbon atoms) or a tetramethylol alkane (with the alkane having 1–3 carbon atoms); poly(meth)acrylates of a polyalkylene glycol addition compound of a polyhydric (tri or more) alcohol; di(meth) acrylates of a cyclic polyol, such as 1,4-cyclohexane diol or 1,4-benzene diol; oligo(meth)acrylates, such as polyester resin (meth)acrylate, epoxy resin (meth)acrylate, urethane resin (meth)acrylate, alkyd resin (meth)acrylate, silicone resin (meth)acrylate or spiran resin (meth)acrylate; bis (meth)acrylamides, such as N,N'-methylene bis(meth) acrylamide, N,N'-ethylenebis (meth)acrylamide, or N,N'-hexamethylene bis(meth)acrylamide; polyvinyl aromatic compounds, such as divinylbenzene, diisopropenylbenzene or trivinylbenzene; poly(unsaturated alcohol esters) of non-polymerizable polycarboxylic acids, such as, divinyl phthalate or diallyl phthalate; and polyfunctional unsaturated ethers, such as poly(divinyl ether), or poly(diallyl ether).

Especially preferred among compounds (iii) are di(meth) acrylates of alkylene glycol and polyvinyl aromatic compounds, with ethylene glycol dimethacrylate and divinylbenzene being most preferred.

Compounds (iii) may be used either singly or as a mixture of two or more of them together.

There are no specific limitations on the monomers (iv) which can be used, in addition to the above-mentioned (i) to (iii), for preparing component (1). Suitable monomers include styrene, α-methyl-styrene, o-methylstyrene, m-methylstyrene, p-methyl-styrene, p-t-butylstyrene, o-methoxystyrene, m-methoxy-styrene, p-methoxystyrene, o-chlorostyrene, m-chloro-styrene, p-chlorostyrene, 1,1-diphenylethylene, N,N-dimethyl-p-aminostyrene, N,N-diethyl-p-aminostyrene, vinylpyridine, vinylpiperidine, vinylpiperadine, vinylfuran, vinylthiophene, vinylthiazole, N-vinyl-pyrrolidone, N-vinylcarbazole, (meth)acrylonitrile, α-chloroacrylonitrile, α-chloromethylacrylonitrile, α-methoxyacrylonitrile, α-ethoxyacrylonitrile, crotonic acid nitrile, cinnamic acid nitrile, itaconic acid dinitrile, maleic acid dinitrile, fumaric acid dinitrile, (meth)acrylamide, N-hydroxymethyl (meth)acrylamide, N-(2-hydroxyethyl) (meth)acrylamide, N,N-bis(2-hydroxyethyl) (meth) acrylamide, crotonic acid amide, cinnamic acid amide, methyl (meth)acrylate, ethyl (meth)acrylate, n-propyl (meth)acrylate, iso-propyl (meth)acrylate, n-butyl (meth) acrylate, iso-butyl (meth)acrylate, sec-butyl (meth)acrylate, t-butyl (meth)acrylate, n-amyl (meth)acrylate, n-octyl (meth)acrylate, 2-ethylhexyl (meth)acrylate, lauryl (meth) acrylate, stearyl (meth)acrylate, methyl crotonate, ethyl crotonate, propyl crotonate, butyl crotonate, methyl cinnamate, ethyl cinnamate, propyl cinnamate, butyl cinnamate, dimethyl itaconate, diethyl itaconate, dimethyl maleate, diethyl maleate, dimethyl fumarate, diethyl fumarate, vinyl chloride, vinylidene chloride, vinyl acetate and allyl acetate.

Preferred compounds (iv) include styrene, (meth) acrylonitrile, methyl (meth)acrylate, ethyl (meth)acrylate and 2-ethylhexyl (meth)acrylate.

The monomers (iv) may be used either singly or as a mixture of two or more of them together.

In the carboxyl-group-containing diene polymer of the present invention, the aliphatic conjugated dienes (i) constitute from 10–95 mol %, preferably 30–90 mol % of the total of monomers (i) to (iii). The unsaturated carboxyl-group-containing monomers (ii), constitute from 0.1–30 mol %, preferably 0.2–20 mol % of the total of monomers (i) to (iii). Monomers containing at least two polymerizable unsaturated groups (iii) constitute from 0.01–20 mol %, preferably 0.1–10 mol % of the total of monomers (i) to (iii). The content of optional monomers (iv) is from 0 to 70 mol % of the total amount of the monomer components.

If the amount of the aliphatic conjugated dienes (i) is smaller than 10 mol %, the strength of the composition after radiation curing tends to be decreased. If the amount of monomers (i) is greater than 95 mol %, the composition exhibits lowered aqueous developing performance.

If the amount of the unsaturated carboxyl groups containing monomers (ii) is less than 0.1 mol %, the composition exhibits lowered aqueous developing performance. If the amount of monomer (ii) is greater than 30 mol %, the composition after radiation curing tends to be hard and brittle.

If the amount of monomers containing at least two polymerizable unsaturated groups (iii) is smaller than 0.01 mol %, the composition tends to exhibit lowered aqueous developing performance. If the amount of monomers (iii) is greater than 20 mol %, the resulting component (1) polymer has insufficient miscibility with the photo-polymerizable unsaturated monomer (3), which is discussed below, resulting in reduced processability, and reduced strength of the composition after radiation curing.

Suitable free-radical polymerization initiators for use in the above-mentioned emulsion polymerization include organic peroxides, such as benzoyl peroxide, lauroyl peroxide, t-butyl hydroperoxide, cumene hydroperoxide, p-menthane hydroperoxide, di-t-butyl peroxide, and dicumyl peroxide; azo compounds, such as azobisisobutylonitrile, azobisisovaleronitrile, and azobisisocapronitrile; inorganic peroxides, such as potassium persulfate, ammonium persulfate, and hydrogen peroxide; redox catalysts consisting of one of the above organic or inorganic peroxides and a reducing agent, such as an organic amine, iron sulfate, sodium sulfite, sodium thiosulfate, sodium formaldehyde sulfoxylate, L-ascorbic acid, and sulfinic acid.

An anionic surfactant, a nonionic surfactant, a cationic surfactant, or an amphoteric surfactant may be used as an emulsifier for the above-mentioned emulsion polymerization, with an anionic surfactant or a nonionic surfactant being particularly preferred. The surfactant may be a fluorine-containing surfactant. In order to adjust the viscosity of the reaction system and the particle size of the resulting polymer, a suspension stabilizer, mentioned below, or a viscosity increasing agent may be used together with the surfactant during emulsion polymerization.

Suitable suspension stabilizers for use in preparing the particles by suspension polymerization include polyvinyl alcohol, sodium polyacrylate, a copolymer of methyl vinyl ether and maleic acid anhydride, a water-soluble polyether, hydroxyethyl cellulose, carboxymethyl cellulose, starch, gelatin, casein, and a salt of arginic acid.

The above-mentioned emulsifiers may be used in the suspension polymerization together with the suspension stabilizers.

In the above polymerization reactions, the reaction components, such as monomers and radical polymerization initiators may be added prior to initiation of the polymerization reaction, or a portion or all of the components may be added incrementally or continuously after commencement of the reaction. The polymerization reaction is normally carried out at 0°–60° C. in an oxygen-free atmosphere (e.g., in a nitrogen atmosphere). The reaction conditions, such as the temperature and the rate of stirring may be appropriately changed during the polymerization reaction. The polymerization reaction may be carried out either continuously or batchwise.

In the manufacture of the compositions of the present invention, component (1) may be used individually or as a mixture of two or more of components (1) together.

Component (2-1)

The polymer having two or more photo-polymerizable unsaturated groups at its molecular chain terminals (hereafter referred to as component (2-1)) used in one embodiment of the present invention is a polymer in which two or more photo-polymerizable unsaturated groups are bonded, directly or via an appropriate bonding group, to one or both terminals of the molecular chain. Although the photo-polymerizable unsaturated groups may be bonded to either or both terminals of the molecular chain, they are preferably bonded to both terminals. A polymer having one of the photo-polymerizable unsaturated groups at each terminal is particularly preferred. When two or more photo-polymerizable unsaturated groups are present in the polymer, they may be the same kind of group or different kinds of groups. Component (2-1) may be either a linear polymer or branched polymer, and when the polymer is a copolymer, it may be a random copolymer, a block copolymer, or a graft copolymer.

There are no specific limitations as to the major monomers (hereafter referred to as major monomers (a)) constructing the molecular chain of component (2-1). They can be appropriately selected depending on the characteristics desired for component (2-1). Suitable major monomers (a) include aliphatic conjugated dienes, alkenes, cycloalkenes, α,β-ethylenically unsaturated carboxylic acid esters, unsaturated ethers, vinyl aromatic compounds, unsaturated nitriles, unsaturated amides, cycloalkanes, cyclic esters, cyclic amides and cyclic ethers. Polymerization of major monomers (a) can be carried out by conventional radical polymerization, anion polymerization, cation polymerization or coordination polymerization in which polymerization procedures such as addition polymerization, polyaddition, polycondensation, or any combination thereof, may be employed depending on the desired polymerization characteristics.

Preferred major monomers (a) include aliphatic conjugated dienes, such as butadiene, isoprene, 1,3-pentadiene, 1,3-hexadiene, 2,3-dimethyl-butadiene, 4,5-diethyl-1,3-octadiene, 3-butyl-1,3-octadiene, chloroprene, 2,3-dichlorobutadiene, and 1,3-cyclopentadiene; alkenes, such as ethylene, propylene, 1-butene, isobutylene, and 2-methyl-1-butene; cycloalkenes, such as cyclobutene, cyclopentene, cyclohexene, and bicyclonorbornene; unsaturated carboxylic acid esters, such as methyl (meth)acrylate, ethyl (meth) acrylate, n-propyl (meth)acrylate, iso-propyl (meth)acrylate, n-butyl (meth)acrylate, iso-butyl (meth)acrylate, sec-butyl (meth)acrylate, t-butyl (meth)acrylate, n-amyl (meth) acrylate, n-octyl (meth)acrylate, 2-ethylhexyl (meth) acrylate, lauryl (meth)acrylate, stearyl (meth)acrylate, methyl crotonate, ethyl crotonate, propyl crotonate, butyl crotonate, methyl cinnamate, ethyl cinnamate, propyl cinnamate, butyl cinnamate, dimethyl itaconate, diethyl itaconate, dimethyl maleate, diethyl maleate, dimethyl fumarate, and diethyl fumarate; vinyl ethers, such as methyl vinyl ether, ethyl vinyl ether, n-propyl vinyl ether, n-butyl vinyl ether, and iso-butyl vinyl ether; vinyl aromatic compounds, such as styrene, α-methylstyrene,o-methylstyrene, m-methylstyrene, p-methylstyrene, p-t-butylstyrene, o-methoxystyrene, m-methoxystyrene, p-methoxystyrene, divinylbenzene, diisopropenylbenzene, o-chlorostyrene, m-chlorostyrene, p-chlorostyrene, 1,1-diphenylethylene, N,N-dimethyl-p-aminostyrene, N,N-diethyl-p-aminostyrene, and vinylpyridine; unsaturated nitriles, such as (meth)acrylonitrile, α-chloroacrylonitrile, α-chloromethylacrylonitrile, α-methoxyacrylonitrile, α-ethoxyacrylonitrile, crotonic acid nitrile, cinnamic acid nitrile, itaconic acid dinitrile, maleic acid dinitrile, and fumaric acid dinitrile; unsaturated amides, such as (meth) acrylamide, N-hydroxymethyl (meth)acrylamide, N-(2-hydroxyethyl) (meth)acrylamide, N,N-bis(2-hydroxyethyl) (meth)acrylamide, crotonic acid amide, and cinnamic acid amide; cycloalkanes, such as 1,1-dimethylcyclopropane, cyclopentane, and norbornene; cyclic esters, such as propiolactone, β-butyrolactone, and diketene; cyclic amides, such as pyrrolidone and ε-caprolactam; and cyclic ethers, such as ethylene oxide, propylene oxide, epichlorohydrin, trioxane, tetrahydrofuran, 3-methyltetrahydrofuran, 3-ethyltetrahydrofuran, and 3-propyltetrahydrofuran.

Major monomers (a) may be used either singly or as a mixture of two or more of them together.

A preferred molecular chain of component (2-1) is a molecular chain containing at least one recurring unit selected from the group consisting of aliphatic conjugated dienes, aromatic vinyl compounds, and unsaturated nitriles (hereafter referred to as Molecular Chain A) or a molecular chain containing at least one recurring unit selected from the group consisting of ester bonds, amide bonds, and ether bonds (hereafter referred to as Molecular Chain B).

In Molecular Chain A, butadiene is preferred as the aliphatic conjugated diene, styrene is preferred as the aromatic vinyl compound, and (meth)acrylonitrile is preferred as the unsaturated nitrile. Particularly preferred recurring units in Molecular Chain B include ring-opened tetrahydrofuran and 3-methyltetrahydrofuran.

Suitable photo-polymerizable unsaturated groups used in component (2-1) include, (meth)acryloyl, $C_2$–$C_{10}$ alkenyl, cinnamoyl, cinnamylideneacetyl, benzalacetophenone, styrylpyridine, α-phenylmaleimide, phenylazide, sulfonylazide, carbonylazide, diazo, o-quinonediazido, furylacryloyl, cumarine, pyrrone, anthracyl, benzophenone, benzoin, styryl, dithiocarbamyl, xanthyl, 1,2,3-thiadiazyl, cyclopropenyl, and azadioxabicyclo.

Preferred photo-polymerizable unsaturated groups are (meth)acryloyl $C_2$–$C_{10}$, alkenyl, and cinnamoyl, with (meth) acryloyl being most preferred.

Methods for introducing two or more photo-polymerizable unsaturated groups to the terminals of the molecular chain of component (2-1) are well known. A typical example consists of synthesizing a precursor molecular chain (precursor molecular chain (a1)) having hydroxy groups at both terminals, reacting the precursor molecular chain (a1) with a polyisocyanate compound having at least two isocyanate groups in a molecule to produce a polymer having isocyanate groups at both terminals, and urethanizing the isocyanate groups at both terminals with a photo-polymerizable unsaturated compound having hydroxy groups (hereafter referred to as complementary photo-polymerizable unsaturated compound A), such as a (meth) acrylic acid derivative having hydroxy groups, preferably a hydroxyalkyl (meth)acrylate (this method is hereafter referred to as Method (Q-1)).

Methods of preparing the precursor molecular chain (a1) include, the methods given in Example 1 (Method (Q-2)) and in Example 2 (Method (Q-3)) below, a method comprising reacting a molecular chain having anions at both terminals with a cyclic ether, such as ethylene oxide, using a bifunctional anionic polymerization initiator and hydrolyzing the reaction product (Method (Q-4)), and a method of reacting a molecular chain having cations at both terminals, which has been obtained using a bifunctional cationic polymerization initiator, with an alkali solution or amino alcohol (Method (Q-5)).

Component (2-1) having two or more photo-polymerizable unsaturated groups at the terminals of the molecular chain can also be prepared by a method using a precursor molecular chain (a2), which has at least one functional group other than a hydroxy group, such as a carboxyl group (including acid anhydride group, used interchangeably with carboxylic acid hereafter), primary or secondary amino group, epoxy group, or carbonyl group, at both terminals, and reacting such a functional group with a compound having a complementary functional group which can react with the functional group (hereafter referred to as complementary unsaturated compound B) and a photo-polymerizable unsaturated group (Method (Q-6)).

Precursor molecular chain (a2) can be prepared using methods similar to that given in Example 1 (Method (Q-2)) or Example 2 (Method (Q-3)). An example of such methods comprises polymerizing major monomers (a) and, optionally, other monomers in the presence of a suitable combination of a polymerization initiator, a chain transfer agent, and/or a polymerization solvent, each having one or more desired functional groups so as to terminate both terminals of the resulting polymer with the desired functional groups (Method (Q-7). Alternatively, precursor molecular chain (a2) having carboxyl groups at both terminals can be prepared by polymerization using 4,4'-azobis-4-valeric acid as the polymerization initiator and dithioglycolic acid as the polymerization solvent (Method (Q-8)).

Suitable complementary unsaturated compounds B include unsaturated carboxylic acids, such as (meth)acrylic acid, crotonic acid, cinnamic acid, maleic acid, fumaric acid, itaconic acid and citraconic acid; unsaturated carboxylic acid halides, such as (meth)acrylic acid chloride; esters of unsaturated carboxylic acids containing an epoxy group, such as glycidyl (meth)acrylate; esters of unsaturated carboxylic acids containing a hydroxy group, such as 2-hydroxyethyl (meth)acrylate or 3-hydroxypropyl (meth) acrylate; and esters of unsaturated carboxylic acids containing an isocyanate group, such as a compound obtained by the reaction of equimolar amounts of an ester of an unsaturated carboxylic acid containing a hydroxy group and a diisocyanate compound (such as tolylene diisocyanate or methylene diisocyanate).

The following methods are given as specific examples of the reactions of precursor molecular chain (a2) and complementary unsaturated compound B.

A (meth)acryloyl group can be introduced, for example, by esterification of (meth)acrylic acid by reacting it with the epoxy group in precursor molecular chain (a2) (Method (Q-9)), converting (meth)acrylic acid chloride into the corresponding acid anhydride by reacting it with the carboxyl group in precursor molecular chain (a2) (Method (Q-10)), converting (meth)acrylic acid chloride into the corresonding amide by reacting it with the amino group in precursor molecular chain (a2) (Method (Q-11)), esterifying glycidyl (meth)acrylate by reacting it with the carboxyl group in precursor molecular chain (a2) (Method (Q-12)), urethanizing a (meth)acrylic acid ester containing an isocyanate group by reacting it with the hydroxy group in precursor molecular chain (a2) (Method (Q-13)), ureating a (meth)acrylic acid ester containing an isocyanate group by reacting it with the primary and/or secondary amino group in precursor molecular chain (a2) (Method (Q-14)), or converting a (meth) acrylic acid ester containing an isocyanate group into an amide compound by reacting it with the carboxyl group or the carboxy acid anhydride in precursor molecular chain (a2) (Method (Q-15)). The photo-polymerizable unsaturated group may be introduced in the same manner as above by using an unsaturated (poly)carboxylic acid or its derivative rather than (meth)acrylic acid or a (meth)acrylic acid derivative (Method (Q-16)).

A cinnamoyl group can be introduced principally in the same manner as the above-mentioned methods of introducing a (meth)acryloyl group.

An alkenyl group can be introduced, for example, by the Wittig reaction of a carbonyl group (aldehyde group or ketone group) in precursor molecular chain (a2) and an alkylidene phosphorane compound (Method (Q-17)), or by reaction of the hydroxy group in precursor molecular chain (a2) having a p-hydroxystyrene unit and allyl bromide (Method (Q-18)).

Introduction of other photo-polymerizable unsaturated groups may be carried out according to conventional organic synthesis methods using known chemicals under conditions known in the art.

In these reactions of precursor molecular chain (a1) and complementary unsaturated compound A, and the reactions of precursor molecular chain (a2) and complementary unsaturated compound B, one reaction may selectively proceed between specific groups or two or more reactions may simultaneously proceed.

In the manufacture of the first composition of the present invention, when precursor molecular chain (a1) or (a2) has an unsaturated carbon-carbon bond, as in the case where a polymer having a diene polymer structure is used, it is possible to hydrogenate a portion of the unsaturated carbon-carbon bond prior to introduction of the photo-polymerizable unsaturated groups at the molecular chain terminals. The level of hydrogenation depends on the characteristics desired for the target photo-sensitive resin composition, and is preferably 70% or less, more preferably 50% or less, most preferably 40% or less.

The number average molecular weight (Mn) of component (2-1) can be suitably selected depending on the desired characteristics of the first composition.

The composition after light curing has greater strength when Mn is large. The aqueous development performance of the composition tends to be promoted as the Mn decreses. An Mn less than 5,000 is preferred, with an Mn in the range of 1,000–4,500 being more preferred, in order to provide suitable aqueous development performance. If Mn is greater than 5,000, the dissolution capability during water-development and transparency of the composition after water-development tend to be reduced, even though strength of the composition after light curing may be improved.

Component (2-1) may be used either individually or as a mixture of two or more of components (2-1) for the manufacture of the first composition.

The amount of component (2-1) used in the manufacture of the first composition can be appropriately determined depending on the purpose to which the composition is directed. This amount is preferably 0.1–300 parts by weight, more preferably 0.5–100 parts by weight, most preferably 1.0–50 parts by weight, per 100 parts by weight of component (1). If the amount of component (2-1) is smaller than 0.1 part by weight, the strength of the composition after radiation curing tends to be decreased; if it is greater than 300 parts by weight, the composition tends to exhibit lowered aqueous developing performance.

Component (2-1) particularly promotes the characteristic balance between the aqueous developing performance of the first composition and the strength of the composition after radiation curing.

Component (2-2)

The polymer having two or more photo-polymerizable unsaturated groups at its molecular chain terminals and at least one functional group selected from photo-polymerizable unsaturated groups, carboxyl group, hydroxy group, amino group, and epoxy group in the side chains (hereafter referred to as component (2-2)) used in the second composition of the present invention is a polymer in which the functional group is bonded directly and/or via an appropriate bonding group to the molecular chain terminals or the side chains. The photo-polymerizable unsaturated group may be present at either one of the molecular chain terminals or both of them. It is desirable, however, to have the photo-polymerizable unsaturated groups present at both terminals. Polymers having one photo-polymerizable unsaturated group at each of the both terminals are particularly preferred. Component (2-2) may be either a linear polymer or a branched polymer and when component (2-2) is a copolymer, it may be a random copolymer, a block copolymer, or a graft copolymer.

There are no specific limitations as to the major monomers (hereafter referred to as major monomers (b)) constructing the molecular chains of component (2-2). They can be appropriately selected depending on the characteristics desired for component (2-2). Suitable major monomers (b) are aliphatic conjugated dienes, alkenes, cycloalkenes, α,β-ethylenically unsaturated carboxylic acid esters, unsaturated ethers, vinyl aromatic compounds, unsaturated nitriles, unsaturated amides, cycloalkanes, cyclic esters, cyclic amides and cyclic ethers. Polymerization of major monomers (b) can be performed by a variety of methods depending upon the polymerization characteristics of the particular major monomer (b) chosen.

Specific examples previously given for major monomers (a) also apply to major monomers (b).

Preferred molecular chains in component (2-2) are the same molecular chains as Molecular Chain A and Molecular Chain B described above with regard to component (2-1).

Component (2-2) can be manufactured, for example, by introducing photo-polymerizable unsaturated groups at the terminals or on the side chains of a precursor molecular chain (precursor molecular chain (b1)), which has at least one functional group, at the molecular chain terminals or side chains, to which a photo-polymerizable unsaturated group can be introduced (Method (R-1)); introducing photo-polymerizable unsaturated groups at the terminals or side chains of a precursor molecular chain (precursor molecular chain (b2)), which has at least two functional groups at the molecular chain terminals to which photo-polymerizable unsaturated groups can be introduced and at least one functional group selected from the group consisting of carboxyl group, hydroxy group, amino group, and epoxy group on the side chains (Method (R-2)); or chemically treating a precursor polymer or copolymer of major monomers (b), which has at least two photo-polymerizable unsaturated groups at its molecular chain terminals, and introducing at least one functional group selected from the group consisting of carboxyl group, hydroxy group, amino group, and epoxy group to side chains of the precursor polymer or copolymer (Method (R-3)).

The same photo-polymerizable unsaturated groups used for component (2-1) can be used as the photo-polymerizable unsaturated groups for component (2-2).

In Method (R-1), precursor molecular chain (b1) can be prepared by copolymerizing major monomers (b) and a monomer having at least one functional group to which a photo-polymerizable unsaturated group can be introduced or a mixture of such monomers (hereafter referred to as functional monomers (b1)) using one of Methods (Q-2), (Q-3), (Q-4), (Q-5), or (Q-7), and, optionally, converting the hydroxy groups in the molecular chain terminals or the side chains into isocyanate groups in the same manner as Method (Q-1) (Method (R-4)).

Suitable functional monomers (b1) include monomers having at least one functional group selected from carboxyl group, hydroxy group, primary or secondary amino group, epoxy group, and carbonyl group.

Specific examples of functional monomers (b1) having a carboxyl group include unsaturated mono-carboxylic acids, such as (meth)acrylic acid, crotonic acid and cinnamic acid; unsaturated polycarboxylic acids or unsaturated polycarboxylic acid anhydrides, such as maleic acid, maleic acid anhydride, fumaric acid, itaconic acid, itaconic acid anhydride, citoraconic acid and mesaconic acid; esters having a free carboxyl group, such as monomethyl esters, monoethyl esters, or monopropyl esters of the above-described unsaturated polycarboxylic acids; nitriles containing a free carboxyl group, such as mononitriles of the above-described unsaturated polycarboxylic acids; amides containing a free carboxyl group, such as monoamides of the above unsaturated polycarboxylic acids; hydroxyalkyl esters containing a free carboxyl group, such as mono(2-hydroxyethyl esters) or mono(2-hydroxypropyl esters) of the above unsaturated polycarboxylic acids; N-hydroxyalkyl derivatives of amides containing a free carboxyl group, such as N-hydroxyalkylamide derivatives of the above unsaturated polycarboxylic acids; and esters containing a free carboxylic acid group made from a non-polymerizable polycarboxylic acid, (such as citric acid, adipic acid and phthalic acid) and an unsaturated compound containing a hydroxy group (such as unsaturated alcohols and 2-hydroxyethyl (meth)acrylate).

Preferred functional monomers (b1) having a carboxyl group include (meth)acrylic acid, maleic acid, crotonic acid, itaconic acid, monovinyl citrate, and monovinyl phthalate.

Specific examples of functional monomers (b1) having a hydroxy group include polyalkylene glycol mono(meth)acrylates, such as 2-hydroxyethyl (meth)acrylate, 2-hydroxypropyl (meth)acrylate, 3-hydroxypropyl (meth)acrylate, 3-chloro-2-hydroxypropyl (meth)acrylate, 2-hydroxybutyl (meth)acrylate, 3-hydroxybutyl (meth)acrylate, 4-hydroxybutyl (meth)acrylate, glycerol mono (meth)acrylate, polyethylene glycol mono(meth)acrylate (with the polymerization degree of the polyethylene glycol being, for example, 2–20), and polypropylene glycol mono (meth)acrylate (with the polymerization degree of the polypropylene glycol being, for example, 2–20); (meth) acrylates having free hydroxy groups of polyhydric (tri or more) alcohols, such as glycerol mono(meth)acrylate, glycerol di(meth)acrylate, 1,2,4-butanetriol mono(meth) acrylate, 1,2,4-butanetriol di(meth)acrylate, trimethylolalkane mono(meth)acrylate (where the carbon number of the alkane is, for example, from 1–3), trimethylolalkane di(meth)acrylate (where the carbon number of the alkane is, for example, from 1–3), tetramethylolalkane mono(meth) acrylate (where the carbon number of the alkane is, for example, from 1–3), tetramethylolalkane di(meth)acrylate (where the carbon number of the alkane is, for example, from 1–3); and tetramethylolalkane tri(meth)acrylate (where the carbon number of the alkane is, for example, from 1–3); hydroxyalkyl esters of other unsaturated carboxylic acids, such as 2-hydroxyethyl crotonate, 2-hydroxypropyl crotonate, 2-hydroxyethyl cinnamate, and 2-hydroxypropyl cinnamate; unsaturated amides containing a hydroxy group, such as N-hydroxymethyl (meth)acrylamide, N-(2-hydroxyethyl) (meth)acrylamide, N,N-bis(2-hydroxyethyl) (meth)acrylamide, crotonic acid N-hydroxymethylamide, crotonic acid N-(2-hydroxyethyl)amide, cinnamic acid N-hydroxymethylamide, and cinnamic acid N-(2-hydroxyethyl)amide; vinyl aromatic compounds containing a hydroxy group, such as o-hydroxystyrene, m-hydroxystyrene, p-hydroxystyrene, o-hydroxy-α-methylstyrene, m-hydroxy-α-methylstyrene, p-hydroxy-α-methylstyrene, and p-vinylbenzyl alcohol; and unsaturated alcohols, such as (meth)acryl alcohol.

Preferred functional monomers (b1) having a hydroxy group include 2-hydroxyethyl (meth)acrylate, 2-hydroxypropyl (meth)acrylate, 3-hydroxypropyl (meth) acrylate, 2-hydroxybutyl (meth)acrylate, and 4-hydroxybutyl (meth)acrylate.

Suitable functional monomers (b1) having a primary and/or secondary amino group include vinylamine, vinylmethylamine, vinylethylamine, (meth)allylamine, (meth)allylmethylamine, (meth)allylethylamine, o-aminostyrene, m-aminostyrene, p-aminostyrene, o-methylaminostyrene, m-methylaminostyrene, p-methylaminostyrene, o-amino-α-methylstyrene, m-amino-α-methylstyrene, p-amino-α-methylstyrene, o-methylamino-α-methylstyrene, m-methylamino-α-methylstyrene, p-methylamino-α-methylstyrene, 2-aminoethyl (meth)acrylate, 2-methylaminoethyl (meth) acrylate, 2-aminopropyl (meth)acrylate, 3-aminopropyl (meth)acrylate, 2-methylaminopropyl (meth)acrylate, 3-methylaminopropyl (meth)acrylate, N-(2-aminoethyl) (meth)acrylamide, N-(2-methylaminoethyl) (meth) acrylamide, N-(3-aminopropyl) (meth)acrylamide, N-(3-methylaminopropyl) (meth)acrylamide, vinylpiperidine, and vinylpiperidine.

Suitable functional monomers (b1) containing an epoxy group include glycidyl (meth)acrylate and (meth)acryl glycidyl ether.

Suitable functional monomers (b1) containing a carbonyl group include (meth)acrylane, vinyl methyl ketone and vinyl ethyl ketone.

Functional monomers (b1) may be used either singly or as a mixture of two or more of them together.

If required, one or more monomers other than the above-mentioned monomers may be used together with the functional monomers (b1). Such other monomers include vinyl chloride, vinylidene chloride, vinyl acetate, allyl acetate, vinylfuran, vinylthiophene, vinylthiazole, N-vinylpyrrolidone, and N-vinylcarbazole.

Method (R-1) can be carried out by suitably selecting the above-mentioned complementary unsaturated compound A and/or complementary unsaturated compound B (depending on the type of functional group in precursor molecular chain (b1) to react with A or B), thus introducing two or more photo-polymerizable unsaturated groups to molecular chain terminals and further introducing photo-polymerizable unsaturated groups to side chains. In this instance, the introduction of photo-polymerizable unsaturated groups to side chains can be performed either concurrently with, before or after, the introduction of such groups to the molecular chain terminals.

The reaction of precursor molecular chain (b1) and complementary unsaturated compound A and/or complementary unsaturated compound B may proceed selectively among specific groups, or two or more reactions among different groups may proceed simultaneously.

The proportion of precursor molecular chains (b1) and said complementary unsaturated compound A and/or complementary unsaturated compound B to be reacted in carrying out Method (R-1) varies depending on the content of functional groups in the molecular chains, the types of precursor molecular chain (b1) and complementary unsaturated compounds A and/or B and the desired characteristics for the second composition of the present invention. The amount of complementary unsaturated compound A and/or complementary unsaturated compound B used per 100 parts by weight of precursor molecular chain (b1) is preferably 0.1–40 parts by weight, more preferably 0.5–30 parts by weight, most preferably 1.0–20 parts by weight. If the amount of complementary unsaturated compound A and/or complementary unsaturated compound B is less than 0.1 part by weight, the photo-sensitivity of the resulting composition tends to be lowered; if it is more than 40 parts by weight, the aqueous developing performance tends to decline.

In the above Method (R-2), precursor molecular chain (b2) can be prepared by copolymerizing major monomers (b) and monomers having at least one functional group selected from carboxyl group, hydroxy group, amino group, and epoxy group (such monomers are hereafter referred to as functional monomers (b2)) using, for example, Methods (Q-2) to (Q-5) or Method (Q-7), and optionally converting the terminal hydroxy groups into isocyanate groups, in the same manner as in said Method (Q-1) (Method (R-5)). Precursor molecular chain (b2) can also be prepared by chemical treatment of polymers prepared from major monomers (b) using the same reactions as in Methods (S-4) to (S-8), described below.

The monomers having carboxyl group, hydroxy group, and epoxy group, described above in connection with functional monomers (b1), may also be used as functional monomers (b2) having a carboxyl group, hydroxy group, and epoxy group, respectively. Monomers having a tertiary amino group can be used as the amino group containing functional monomers (b2), in addition to the monomers having a primary and/or secondary amino group previously mentioned in connection with functional monomers (b1). Suitable monomers having a tertiary amino group include (meth)acrylates having a tertiary amino group, such as 2-dimethylaminoethyl (meth)acrylate, 2-diethyl-aminoethyl (meth)acrylate, 2-dimethylaminopropyl (meth)acrylate and 3-dimethylaminopropyl (meth)acrylate; (meth)acrylamides having a tertiary amino group, such as N-(2-dimethylaminoethyl) (meth)acrylamide, N-(2-dimethylaminopropyl) (meth)acrylamide and N-(3-dimethylaminopropyl) (meth)acrylamide; unsaturated amines having a tertiary amino group, such as vinyldimethylamine, vinyldiethylamine and vinyldiphenylamine; and vinyl aromatic compounds having a tertiary amino group, such as N,N-dimethylaminostyrene, N,N-diethylaminostyrene, N,N-dimethylamino-α-methylstyrene, and N,N-diethylamino-α-methylstyrene.

Functional monomers (b2) may be used either singly or as a mixture of two or more of them together.

If required, functional monomers (b2) may be used together with one or more monomers other than the above-mentioned monomers, such as vinyl chloride, vinylidene chloride, vinyl acetate, allyl acetate, vinylfuran, vinylthiophene, vinylthiazole, N-vinylpyrrolidone, or N-vinylcarbazole.

Method (R-2) can be carried out by suitably selecting the previously mentioned complementary unsaturated compound A and/or complementary unsaturated compound B (depending on the type of functional group present in precursor molecular chain (b2) to react with A or B), thus introducing two or more photo-polymerizable unsaturated groups to molecular chain terminals.

The amount of functional monomers (b2) used for component (2-2) in Method (R-2) varies depending on such parameters as the types of functional groups in the monomers and the desired characteristics for the second composition. A preferred amount of (b2) is from 0.1–30% by weight, more preferably 0.5–25% by weight, most preferably 1.0–20% by weight, based on the total weight of component (2-2). If the amount of functional monomer (b2) is less than 0.1% by weight, the photo-sensitivity of the resulting composition tends to be lowered; if it is more than 30% by weight, the aqueous developing performance tends to decline.

In Method (R-3), major monomers (b) are polymerized or, optionally, copolymerized together with other monomers, using one of Methods (Q-2), (Q-3), (Q-4), (Q-5), or (Q-7), and, further, as required, the hydroxy groups in the molecular chain terminals are converted into isocyanate groups in the same manner as Method (Q-1), and then two or more photo-polymerizable unsaturated groups are introduced to the terminals of the produced polymer. Afterward, the reaction described below is carried out.

Reactions used in Method (R-3) may be, for example, carboxylation or hydroxylation by hydrolysis of the ester group (Method (R-6)), hydroxylation by hydrolysis of the epoxy group or conversion of the amide group into an N-methylol group (Method (R-7)) or amination by aminomethylation of the aromatic group (Method (R-8)). These reactions, their reaction conditions, and the chemicals used are known per se in the art.

The proportion of functional groups contained in component (2-2) manufactured by Method (R-3) may be controlled in the same manner as the proportion of functional groups contained in component (2-2) manufactured by Method (R-2).

In carrying out Method (R-1) or Method (R-2), when precursor molecular chains (b1) or (b2) have carbon-carbon unsaturated bonds, as in the case where a polymer having a diene polymer structure is used, a portion of the carbon-carbon unsaturated bonds may be hydrogenated prior to introduction of the photo-polymerizable unsaturated groups. Further, in carrying out Method (R-3), when the precursor polymer or copolymer has carbon-carbon unsaturated bonds prior to introduction of photo-polymerizable unsaturated groups into the molecular chain terminals, as in the case where a polymer having a diene polymer structure is used, a portion of the carbon-carbon unsaturated bonds may be hydrogenated prior to the introduction of the photo-polymerizable unsaturated groups. In such cases, the level of hydrogenation is preferably 70% or less, more preferably 50% or less, and most preferably 40% or less.

The desired number average molecular weight (Mn) of component (2-2) can be appropriately set depending on the characteristics desired for the second composition. Generally, the composition after light curing has a greater strength when Mn is large. The aqueous development performance of the composition tends to be improved as the Mn decreases. An Mn less than 5,000 is preferred, with an Mn in the range of 1,000–4,500 more preferred, when the aqueous development performance of the composition is important. If the Mn of component (2-2) is greater than 5,000, the dissolution characteristic of the composition during aqueous development and the transparency after development tend to be reduced, even though the strength of the composition after light curing may be increased.

Component (2-2) may be used either singly or as a mixture of two or more of components (2-2) in the manufacture of the second composition.

The amount of component (2-2) used in the manufacture of the second composition can be appropriately determined depending on the purpose to which the composition is directed. This amount is preferably 0.1–300 parts by weight, more preferably 0.5–100 parts by weight, most preferably 1.0–50 parts by weight, per 100 parts by weight of component (1). If the amount of component (2-2) is smaller than 0.1 part by weight, the strength of the composition after radiation curing tends to be decreased; if it is greater than 300 parts by weight, the composition tends to exhibit poor aqueous developing performance.

Component (2-2) particularly promotes the characteristic balance between the aqueous developing performance of the second composition and the strength of the composition after radiation curing.

Component (2-3)

The non-diene-type polymer having at least one functional group selected from photo-polymerizable unsaturated groups, carboxyl group, hydroxy group, amino group, and epoxy group in the side chains (hereafter referred to as component (2-3)) used in the third composition of the present invention is a non-diene type polymer in which the functional group is bonded directly and/or via an appropriate bonding group to the molecular side chains. Component (2-3) may be either a linear polymer or a branched polymer and when the polymer is a copolymer, it may be a random copolymer, a block copolymer, or a graft copolymer.

Major monomers constructing the molecular chains of component (2-3) (hereafter referred to as major monomers (c)) may be appropriately selected depending on the characteristics desired for component (2-3). Suitable major monomers (c) include alkenes, cycloalkenes, $\alpha,\beta$-ethylenically unsaturated carboxylic acid esters, unsaturated ethers, vinyl aromatic compounds, unsaturated nitriles, unsaturated amides, cycloalkanes, cyclic esters, cyclic amides and cyclic ethers. Polymerization of major monomers (c) can be carried by a variety of methods depending on the polymerization characteristics of the particular major monomer (c) chosen.

Major monomers (a), discussed above in connection with component (2-1), except for aliphatic conjugated dienes, may be used as major monomers (c).

Preferred molecular chains in component (2-3) include the same molecular chains as Molecular Chain A and Molecular Chain B mentioned above with respect to component (2-1).

Component (2-3) can be manufactured, for example, by introducing photo-polymerizable unsaturated groups to the side chains of a precursor molecular chain (precursor molecular chain (c1)), which is comprised of a copolymer made from major monomer (c) and a monomer (functional monomer (c1)) having a functional group to which a photo-polymerizable unsaturated group can be introduced (Method (S-1)); copolymerizing major monomer (c) and a monomer (functional monomer (c2)) having at least one functional group selected from the group consisting of carboxyl group, hydroxy group, amino group, and epoxy group (Method (S-2)); and chemically treating a precursor polymer or copolymer of major monomers (c) to introduce at least one functional group selected from the group consisting of carboxyl group, hydroxy group, amino group, and epoxy group (Method (S-3)).

In Method (S-1), the same functional monomers which were discussed above for functional monomers (b1) can be used as the functional monomers (c1).

Functional monomers (c1) may be used either singly or as a mixture of two or more of them.

If required, one or more monomers other than the above-mentioned monomers may be used together with functional monomers (c1). These other monomers include such monomers as vinyl chloride, vinylidene chloride, vinyl acetate, allyl acetate, vinylfuran, vinylthiophene, vinylthiazole, N-vinylpyrrolidone and N-vinylcarbazole.

The photo-polymerizable unsaturated groups discussed above with respect to component (2-1) can be used as the photo-polymerizable unsaturated groups used in Method (S-1).

Method (S-1) can be carried out by suitably selecting the above-mentioned complementary unsaturated compound A and/or complementary unsaturated compound B (depending on the type of the functional group in precursor molecular chain (c1)), optionally converting the hydroxy group into an isocyanate group in the same manner as in Method (Q-1), and reacting precursor molecular chain (c1) and complementary unsaturated compound A and/or complementary unsaturated compound B.

This reaction of precursor molecular chain (c1) and complementary unsaturated compound A and/or complementary unsaturated compound B may proceed selectively among specific groups, or two or more reactions among different groups may proceed simultaneously.

The proportion of precursor molecular chains (c1) and complementary unsaturated compound A and/or complementary unsaturated compound B to be reacted in carrying out Method (S-1) varies depending on parameters such as the amount of functional groups contained in molecular chain (c1), the types of complementary unsaturated compounds A and/or B, and the desired characteristics for the third composition of the present invention. The amount of complementary unsaturated compound A and/or complementary unsaturated compound B used per 100 parts by weight of the precursor molecular chain (c1) is preferably 0.1–40 parts by weight, more preferably 0.5–30 parts by weight, most preferably 1.0–20 parts by weight. If the amount of complementary unsaturated compound A and/or complementary unsaturated compound B is less than 0.1 part by weight, the photo-sensitivity of the resulting composition tends to be lowered; if it is more than 40 parts by weight, the aqueous developing performance tends to decline.

The same functional monomers previously given for functional monomers (b2) can be used as functional monomers (c2) in Method (S-2).

If required, one or more monomers other than the above-mentioned monomers may be used together with functional monomers (c2). These other monomers include, such monomers as, vinyl chloride, vinylidene chloride, vinyl acetate, allyl acetate, vinylfuran, vinylthiophene, vinylthiazole, N-vinylpyrrolidone and N-vinylcarbazole.

The content of functional monomers (c2) in the copolymers produced by Method (S-2) varies depending on such factors as the types of functional groups in the monomers, and the desired characteristics for the third composition. The content of functional monomer (c2) is preferably 0.1–30% by weight, more preferably 0.5–25% by weight, most preferably 1.0–20% by weight based on the total weight of the copolymer. If the content of functional monomer (c2) is less than 0.1% by weight, the photo-sensitivity of the resulting composition tends to be lowered; if it is more than 30% by weight, the aqueous developing performance tends to decline.

In carrying out Method (S-3), a variety of reactions, such as an addition reaction, a substitution reaction or a reducing reaction, may be used depending on factors such as the particular major monomers (c) and the type of functional groups to be introduced. Examples of such reactions include an addition reaction of functional monomer (c2) (Method (S-4)), carboxylation or hydroxylation by hydrolysis of the ester group (Method (S-5)), hydroxylation by hydrolysis of the epoxy group, by conversion of the amide group into an N-methylol group, or by reduction of the carbonyl group (Method (S-6)), amination by reduction of a nitrile group or an amide group or by aminomethylation of the aromatic group, (Method (S-7)), and epoxidation of carbon-carbon unsaturated bonds in molecular side chains (Method (S-8)). These reactions, the reaction conditions, and the chemicals used are known per se in the art.

The proportion of functional monomers (c2) reacted in Method (S-4) varies depending on factors such as the types of functional groups contained in the major monomers and the characteristics desired for the third composition of the present invention. The proportion of functional monomers (c2) per 100 parts by weight of the resulting precursor polymer or copolymer produced from major monomer (c) is preferably 0.1–40 parts by weight, more preferably 0.5–30 parts by weight, most preferably 1.0–20 parts by weight. If the amount of functional monomers (c2) is less than 0.1 part by weight, the photo-sensitivity of the resulting composition tends to be lowered; if it is more than 40 parts by weight, the aqueous developing performance tends to decline. The proportion of functional groups contained in component (2-3) manufactured by Method (S-5) to Method (S-8) may be controlled in the same manner as the proportion of functional groups contained in component (2-3) manufactured by Method (S-4).

The number average molecular weight (Mn) of component (2-3) can be readily set depending on the characteristics desired for the third composition. Generally, the composition after light curing has very high strength when Mn is large. The aqueous development performance of the composition tends to increase as the Mn decreases. An Mn less than 5,000 is preferred, with an Mn in the range of 1,000–4,500 being more preferred, when the aqueous development performance of the composition is important. If the Mn of component (2-3) is greater than 5,000, the dissolution characteristic during aqueous development and the transparency after development tend to be reduced, even though the strength of the composition after light curing may be improved.

Component (2-3) may be used either singly or as a mixture of two or more of components (2-3) in the manufacture of the third composition.

The amount of component (2-3) used in the manufacture of the third composition can be appropriately determined depending on the purpose to which the composition isdirected. This amount is preferably 0.1–300 parts by weight, more preferably 0.5–100 parts by weight, most preferably 1.0–50 parts by weight, per 100 parts by weight of component (1). If the amount of component (2-3) is smaller than 0.1 part by weight, the strength of the composition after radiation curing tends to be decreased; if it is greater than 300 parts by weight, the composition tends to exhibit a low aqueous developing performance.

Component (2-3) particularly promotes the characteristic balance between the aqueous developing performance of the third composition and strength of the composition after radiation curing.

Component (2-4)

The linear diene-type polymer having at least one functional group selected from photo-polymerizable unsaturated groups, carboxyl group, hydroxy group, amino group, and epoxy group in side chains, and having an Mn of smaller than 5,000 (hereafter referred to as component (2-4)) used in the fourth composition of the present invention is a linear diene-type polymer in which the functional group is bonded directly and/or via an appropriate bonding group to the molecular side chains. Component (2-4), when it is a copolymer, may be either a random copolymer or a block copolymer.

Major monomers constructing the molecular chains of component (2-4) (hereafter referred to as major monomers (d)) include an aliphatic conjugated diene as an essential component. Depending on the characteristics desired for component (2-4), other monomers may also be included, such as alkenes, cycloalkenes, α,β-ethylenically unsaturated carboxylic acid esters, unsaturated ethers, vinyl aromatic compounds, unsaturated nitriles or unsaturated amides. Polymerization of these major monomers (d) can be performed by a variety of methods depending on the polymerization characteristics of the particular major monomer (d) used.

Major monomers (a), discussed above with respect to component (2-1), may be used as major monomers (d).

If required, one or more monomers other than the above-mentioned monomers may be used together with the major monomers (d). Suitable other monomers include vinyl chloride, vinylidene chloride, vinyl acetate, allyl acetate, vinylfuran, vinylthiophene, vinylthiazole, N-vinylpyrrolidone and N-vinylcarbazole.

Preferable molecular chains in component (2-4) are molecular chains having a recurring unit of an aliphatic conjugated diene and, optionally, at least one recurring unit containing a vinyl aromatic compound, preferably styrene, and an unsaturated nitrile, preferably (meth)acrylonitrile.

Component (2-4) can be manufactured, for example, by introducing photo-polymerizable unsaturated groups to the side chains of a precursor molecular chain (precursor molecular chain (d1)), which is comprised of a copolymer made from major monomer (d) and a monomer (functional monomer (d1)) having a functional group to which a photo-polymerizable unsaturated group can be introduced (Method (T-1)); copolymerizing major monomer (d) and a monomer (functional monomer (d2)) having at least one functional group selected from the group consisting of carboxyl group, hydroxy group, amino group, and epoxy group (Method (T-2)); and chemically treating a precursor polymer or copolymer of major monomers (d) to introduce at least one functional group selected from the group consisting of carboxyl group, hydroxy group, amino group, and epoxy group (Method (T-3)).

In Method (T-1), the same functional monomers which are discussed above for functional monomers (b1) can be used as functional monomers (d1).

Functional monomers (d1) may be used either singly or as a mixture of two or more of them together.

If required, one or more monomers other than the above-mentioned monomers may be used together with the functional monomers (d1). Suitable other monomers include, vinyl chloride, vinylidene chloride, vinyl acetate, allyl acetate, vinylfuran, vinylthiophene, vinylthiazole, N-vinylpyrrolidone, and N-vinylcarbazole.

The photo-polymerizable unsaturated groups discussed above with respect to component (2-1) can be given as examples of photo-polymerizable unsaturated groups used in Method (T-1).

Method (T-1) can be carried out by suitably selecting the above-mentioned complementary unsaturated compound A and/or complementary unsaturated compound B (depending on the type of the functional groups in precursor molecular chain (d1)), optionally converting the hydroxy group into an isocyanate group in the same manner as in Method (Q-1), and reacting precursor molecular chain (d1) and complementary unsaturated compound A and/or complementary unsaturated compound B.

This reaction of precursor molecular chain (d1) and complementary unsaturated compound A and/or complementary unsaturated compound B may proceed selectively among specific groups, or two or more reactions among different groups may proceed simultaneously.

The proportion of precursor molecular chains (d1) and complementary unsaturated compound A and/or complementary unsaturated compound B to be reacted in carrying out Method (T-1) varies depending on factors such as the content of functional groups in the molecular chain, the types of complementary unsaturated compounds A and/or B, and the desired characteristics for the fourth composition of the present invention. The amount of complementary unsaturated compound A and/or complementary unsaturated compound B used per 100 parts by weight of the precursor molecular chain (d1) is preferably 0.1–40 parts by weight, more preferably 0.5–30 parts by weight, most preferably 1.0–20 parts by weight. If the amount of complementary unsaturated compound A and/or complementary unsaturated compound B is less than 0.1 part by weight, the photo-sensitivity of the resulting composition tends to be too low; if it is more than 40 parts by weight, the aqueous developing performance tends to decline.

In Method (T-2), the same functional monomers provided above as functional monomers (b2) can be used as functional monomers (d2).

If required, one or more monomers other than the above-mentioned monomers may be used together with functional monomers (d2). Suitable other monomers include, vinyl chloride, vinylidene chloride, vinyl acetate, allyl acetate, vinylfuran, vinylthiophene, vinylthiazole, N-vinylpyrrolidone and N-vinylcarbazole.

The content of functional monomers (d2) in the polymer produced by Method (T-2) varies depending on various factors, such as the types of functional groups in the monomers and the desired characteristics for the fourth composition. The preferred amount is from 0.1–30% by weight, more preferably 0.5–25% by weight, most preferably 1.0–20% by weight based on the total weight of the polymer. If the amount of functional monomer (d2) is less than 0.1% by weight, the photo-sensitivity of the resulting composition tends to be too low; if it is more than 30% by weight, the aqueous developing performance tends to decline.

Reactions mentioned above with respect to Method (S-4) to (S-8) are applicable to Method (T-3), depending on such factors as the major monomers (d) used and the type of functional groups to be introduced.

In Method (T-3), if functional monomer (d2) is reacted with the precursor polymer or copolymer by an addition reaction (Method (T-4)), the amount of the functional monomer (d2) used depends on the characteristics desired for the fourth composition of the present invention. Preferably the amount of functional monomer (d2) is from 0.1–40 parts by weight, more preferably 0.5–30 parts by weight, most preferably 1.0–20 parts by weight based on the total weight of the precursor polymer or copolymer. If the amount of major monomer (d2) is less than 0.1 part by weight, the photo-sensitivity of the resulting composition tends to be too low; if it is more than 40 parts by weight, the aqueous developing performance tends to decline. Furthermore, in Method (T-3), the proportions of functional groups in component (2-4) produced by carboxylation (Method (T-5)), hydroxylation (Method (T-6)), amination (Method (T-7)), or epoxidation (Method (T-8)) of the precursor polymer or copolymer can be adjusted in the same manner as the above-mentioned adjustment of the functional group proportions in component (2-4) according to Method (T-4).

In the manufacture of the fourth composition of the present invention, when component (2-4) contains carbon-carbon unsaturated bonds, these carbon-carbon unsaturated bonds may be hydrogenated, provided that in Method (T-1) the hydrogenation is carried out prior to the introduction of the photo-polymerizable unsaturated groups into the molecular side chains. In such cases, the level of hydrogenation is preferably 70% or less, more preferably 50% or less, most preferably 40% or less.

The preferred number average molecular weight (Mn) of component (2-4) is smaller than 5,000, more preferably in the range of 500 to 4,500, most preferably in the range of 1,000 to 4,000. If the Mn of component (2-4) is greater than 5,000, the dissolution of the composition during aqueous development and the transparency after development tend to be reduced, even though the strength of the composition after light curing may be increased to a certain degree.

Component (2-4) may be used either alone or as a mixture of two or more of components (2-4) in the manufacture of the fourth composition.

The amount of component (2-4) used in the manufacture of the fourth composition can be appropriately determined depending on the purpose to which the composition is directed. The amount of component (2-4) is preferably 0.1–300 parts by weight, more preferably 0.5–100 parts by weight, most preferably 1.0–50 parts by weight, per 100 parts by weight of component (1). If the amount of component (2-4) is smaller than 0.1 part by weight, the strength of the composition after radiation curing tends to be decreased; if it is greater than 300 parts by weight, the composition tends to exhibit only poor aqueous developing performance.

Component (2-4) particularly promotes the characteristic balance between the aqueous developing performance of the fourth composition of the present invention and the strength of the composition after radiation curing.

Component (3)

The photo-polymerizable unsaturated monomer (hereafter referred to as component (3)) used in each of the first to fourth compositions of the present invention is a compound having an unsaturated bond, which can polymerize by irradiation with light in the presence of a photo-polymerization initiator, described below as component (5).

Examples of component (3) include vinyl aromatic compounds, such as styrene, α-methylstyrene, o-methylstyrene, m-methylstyrene, p-methylstyrene, p-t-butylstyrene, o-methoxystyrene, m-methoxystyrene, p-methoxystyrene, divinylbenzene, diisopropenylbenzene, o-chlorostyrene, m-chlorostyrene, p-chlorostyrene, 1,1-diphenylethylene, N,N-dimethyl-p-aminostyrene, N,N-diethyl-p-aminostyrene and vinylpyridine; unsaturated nitriles, such as (meth)acrylonitrile, α-chloroacrylonitrile, α-chloromethylacrylonitrile, α-methoxyacrylonitrile, α-ethoxyacrylonitrile, crotonic acid nitrile, cinnamic acid nitrile, itaconic acid dinitrile, maleic acid dinitrile and fumaric acid dinitrile; esters of unsaturated monocarboxylic acids, such as alkyl (meth)acrylates, (e.g., methyl (meth) acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth) acrylate, n-amyl (meth)acrylate, n-octyl (meth)acrylate, 2-ethylhexyl (meth)acrylate, lauryl (meth)acrylate and stearyl (meth)acrylate); methyl crotonate, ethyl crotonate, propyl crotonate, butyl crotonate, methyl cinnamate, ethyl cinnamate, propyl cinnamate and butyl cinnamate; fluoroalkyl (meth)acrylates, such as trifluoroethyl (meth)acrylate, pentafluoropropyl (meth)acrylate, and heptafluorobutyl (meth)acrylate); mono or di(meth)acrylates of alkylene glycols, such as ethylene glycol, 1,2-propane diol, 1,3-propane diol, 1,4-butane diol, 1,5-pentane diol and 1,6-hexane diol; mono or di(meth)acrylates of polyalkylene glycols (where the polymerization degree of the polyalkylene glycol is, for example, from 2–23), such as polyethylene glycol and polypropylene glycol; alkoxyalkyl (meth) acrylates, such as 2-methoxyethyl (meth)acrylate, 2-ethoxyethyl (meth)acrylate, 2-methoxypropyl (meth) acrylate, 2-ethoxypropyl (meth)acrylate, 3-methoxypropyl (meth)acrylate, and 3-ethoxypropyl (meth)acrylate; (meth) acrylates of alkoxypolyalkylene glycol (where the polymerization degree of polyalkylene glycol is, for example, from 2–23), such as methoxypolyethylene glycol, ethoxypolyethylene glycol, methoxypolypropylene glycol and ethoxypolypropylene glycol; aryloxyalkyl (meth)acrylates, such as 2-phenoxyethyl (meth)acrylate, 2-phenoxypropyl (meth) acrylate and 3-phenoxypropyl (meth)acrylate; mono(meth) acrylates of aryloxypolyalkylene glycols, such as phenoxypolyethylene glycol (meth)acrylate and phenoxypolypropylene glycol (meth)acrylate; cyanoalkyl (meth)acrylates, such as cyanoethyl (meth)acrylate and, cyanopropyl (meth)acrylate; mono or oligo(meth)acrylates of a polyhydric (tri or more) alcohol, such as glycerine, 1,2,4-butanetriol, trimethylol alkane (with the alkane having 1–3 carbon atoms) and tetramethylol alkane (with the alkane having 1–3 carbon atoms); mono or oligo(meth)acrylates of a polyalkylene glycol addition compound with a polyhydric (tri or more) alcohol; mono or di(meth)acrylates of a cyclic polyol, such as 1,4-cyclohexane diol, 1,4-benzene diol and 1,4-dihydroxyethylbenzene; unsaturated monocarboxylic acids, such as (meth)acrylic acid, crotonic acid and cinnamic acid; unsaturated polycarboxylic acid and anhydrides, such as itaconic acid, itaconic acid anhydride, maleic acid, maleic acid anhydride, fumaric acid, citoraconic acid and mesaconic acid; esters containing a free carboxylic acid, such as monomethyl esters, monoethyl esters, monopropyl esters, monobutyl esters, monohexyl esters, or monooctyl esters of the above unsaturated carboxylic acids; polyesters, such as dimethyl esters, diethyl esters, dipropyl esters, dibutyl esters, dihexyl esters, or dioctyl esters of the above unsaturated carboxylic acids; and unsaturated amides, such as (meth)acrylamide, N-hydroxymethyl (meth)acrylamide, N-(2-hydroxyethyl) (meth)acrylamide, N,N-bis(2-hydroxyethyl) (meth)acrylamide, N,N'-methylene bis(meth) acrylamide, N,N'-ethylene bis(meth)acrylamide, N,N'-hexamethylene bis(meth)acrylamide, crotonic acid amide, and cinnamic acid amide.

Of the above mentioned compounds, compounds having a molecular weight of 1,000 or smaller and containing 1–4 (meth)acryloyl groups and no amino group are preferred.

More preferred compounds include nonaethylene glycol mono(meth)acrylate, lauryl (meth)acrylate, hexanediol (meth)acrylate, trimethylolpropane tri(meth)acrylate and (meth)acrylic acid.

Component (3) may be used either alone or as a mixture of two or more of components (3). Suitable selection of component (3) or a suitable combination of two or more of components (3) can provide desired characteristics to the first to the fourth compositions after light curing.

It is possible to control the fluidity of the first to the third compositions by the amount of component (3) incorporated therein. For example, the composition may be made wax-like, rubber-like, or a low-viscosity liquid. Thus, the amount of component (3) can be determined depending on the use to which these compositions are directed. The amount of component (3) used per 100 parts by weight of component (1) is preferably 5–1,000 parts by weight, more preferably 10–500 parts by weight. If the amount of component (3) is less than 5 parts by weight, the strength of the composition after light curing may be too low; if it is greater than 1,000 parts by weight, the composition exhibits a large contraction after light curing, which may impair its usefulness in an aqueous developing system, reduce the water resistance of the composition after light curing, and may limit the flexibility of the viscosity design of the composition.

Component (4)

The compound containing an amino group (hereafter referred to as component (4)) used in each of the first to fourth compositions of the present invention is a compound which contains at least one primary, secondary, or tertiary amino group.

Examples of component (4) include primary amine compounds, such as methylamine, ethylamine, propylamine, butylamine, cyclohexylamine, and aniline; secondary amines, such as dimethylamine, methylethylamine, diethylamine, methylpropylamine, ethylpropylamine, dipropylamine, methylbutylamine, ethylbutylamine, propylbutylamine, dibutylamine, pyrrole, pyrolidine, piperidine, piperadine, indole, indoline and carbazole; and tertiary amines, such as trialkylamines, (e.g., trimethylamine, methyldiethylamine, dimethylethylamine, triethylamine, dimethylpropylamine, methylethylpropylamine, diethylpropylamine, methyldipropylamine, ethyldipropylamine, tripropylamine, dimethylbutylamine, methyldibutylamine, methylethylbutylamine, diethylbutylamine, ethyldibutylamine, methylpropylbutylamine, ethylpropylbutylamine, dipropylbutylamine, propyldibutylamine and tributylamine); alkylalkanol tertiary amines, (e.g., dimethylethanolamine, methyldiethanolamine, diethylethanolamine, and ethyldiethanolamine) and trialkanol amines (e.g., triethanolamine, diethanolpropanolamine, ethanoldipropanolamine and tripropanolamine); N,N-dialkylaminoalkoxyalkanols, such as N,N-dimethylaminoethoxyethanol, N,N-diethylaminoethoxyethanol, N,N-dimethylaminoethoxypropanol and N,N-diethylaminoethoxypropanol; aromatic tertiary amines, such as pyridine, 1,3,5-triazine and quinoline; dialkylaminoalkyl (meth)acrylates, such as 2-dimethylaminoethyl (meth) acrylate, 2-diethylaminoethyl (meth)acrylate, 2-dipropylaminoethyl (meth)acrylate, 2-dimethylaminopropyl (meth)acrylate, 3-dimethylaminopropyl (meth) acrylate, 2-diethylaminopropyl (meth)acrylate, 3-diethylaminopropyl (meth)acrylate, 2-dipropylaminopropyl (meth)acrylate, and 3-dipropylaminopropyl (meth) acrylate; dialkyaminoalkoxyalkyl (meth)acrylates, such as 2-dimethylaminoethoxyethyl (meth)acrylate and 2-diethylaminoethoxyethyl; (meth)acrylamides containing a tertiary amino group, such as N-(2-dimethylaminoethyl) (meth)acrylamide, N-(2-diethylaminoethyl) (meth) acrylamide, N-(2-dimethylaminopropyl) (meth)acrylamide, N-(3-dimethylaminopropyl) (meth)acrylamide, N-(2-diethylaminopropyl) (meth)acrylamide and N-(3-diethylaminopropyl) (meth)acrylamide; and carbamates containing a tertiary amino group, such as N,N-dimethylaminoethyl-N'-(meth)acryloyl carbamate and N,N-diethylaminoethyl-N'-(meth)acryloyl carbamate.

The compounds of component (4) may be used either singly or as a mixture of two or more of them together.

Preferred compounds for component (4) are tertiary amines which exhibit excellent aqueous development ability. More preferred, in view of the strength of the composition after light curing, are compounds having an α,β-ethylenically unsaturated group, such as (meth)acrylates containing a tertiary amino group, (meth)acrylamides containing a tertiary amino group, trialkyl amines, alkyl alkanol tertiary amines and trialkanol amines.

Most preferred among these compounds are N-(3-dimethylaminopropyl) (meth)acrylamide, N-(2-dimethylaminopropyl) (meth)acrylamide, N-(2-dimethylaminoethyl) (meth)acrylamide, 2-diethylaminoethyl (meth)acrylate, 2-diethylaminopropyl (meth)acrylate, 2-dimethylaminopropyl (meth)acrylate, triethanolamine, and tributylamine.

The amount of component (4) in the first to fourth compositions of the present invention can be determined depending on the use to which these compositions are directed. The amount of component (4), in terms of the molar content of amino group contained in component (4) per 1 mol of carboxyl group in component (1), is preferably 0.1 mol or greater, more preferably 0.4 mol or greater. If the content of amino group in component (4) is less than 0.1 mol, the aqueous development capability tends to be lowered. However, an amino content exceeding 5 mol is uneconomical, since further increase of the aqueous development capability does not correlate with the use of higher amounts.

Both component (3) and component (4) of the compositions of the present invention contain compounds which are the same. When the same compounds are used for both component (3) and component (4), the amounts of these compounds must be adjusted so as to satisfy both of the preferred ranges of component (3) and component (4) as defined above.

Component (5)

The photo-polymerization initiator (hereafter referred to as component (5)) used in each of the first to fourth compositions of the present invention is a component which can initiate or promote the polymerization of component (3) upon the application of light or radiation, and, in a preferred embodiment of the present invention, a component which can also initiate or promote the polymerization by light of compounds among component (4) having an α,β-ethylenically unsaturated group.

Examples of component (5) include α-diketone compounds, such as diacetyl, methyl benzoyl formate and benzyl; acyloins, such as benzoin and pivaloin; acyloin ethers, such as benzoin methyl ether, benzoin ethyl ether, benzoin i-propyl ether, and benzoin i-butyl ether; multi-nuclear quinones, such as anthraquinone, 2-ethylanthraquinone, 2-t-butylanthraquinone and 1,4-naphthoquinone; acetophenones, such as acetophenone, 2-hydroxy-2-methyl-propiophenone, 1-hydroxycyclohexyl phenyl ketone, 2,2-dimethoxy-phenylacetophenone, 2,2-diethoxyacetophenone and trichloroacetophenone; benzophenones, such as benzophenone, methyl-o-benzoylbenzoate and Michiler's ketones; and xanthones, such as xanthone, thioxanthone, 2-chloroxanthone, and 2-chlorothioxanthone.

The amount of component (5) to be incorporated in making the compositions of the present invention is preferably 0.1–20 parts by weight, more preferably 0.5–10 parts by weight per 100 parts by weight of component (1). If the amount of component (5) is less than 0.1 part by weight, the light curability of the composition is insufficient. The use of an amount exceeding 20 parts by weight is uneconomical, since excess amounts of component (5) do not provide a corresponding increase in light curing rate. Additionally, a large amount of component (5) may impair mutual solubility of this component with component (3) or component (4), making it difficult to disperse component (5) homogeneously.

Various conventional additives may be incorporated in the first to fourth compositions of the present invention, as needed.

One additive which may be used is a thermal addition polymerization inhibitor which acts as a storage stabilizer.

Suitable thermal addition polymerization inhibitors include hydroxy aromatic compounds, such as hydroquinone, hydroquinone monomethyl ether, mono-t-butylhydroquinone, catechol, p-t-butylcatechol, p-methoxyphenol, 2,6-di-t-butyl-p-cresol, 2,6-di-t-butyl-m-cresol, pyrogallol and β-naphthol; quinones, such as benzoquinone, 2,5-diphenyl-p-benzoquinone, p-toluquinone and p-xyloquinone; nitro compounds, such as nitrobenzene, m-dinitrobenzene, 2-methyl-2-nitroso-propane, α-phenyl-t-butylnitrone and 5,5-dimethyl-1-pyrroline-1-oxide; amines, such as chloranyl amines, diphenylamine, diphenylpicrylhydrazine, phenol-α-naphthylamine, pyridine and phenothiazine; sulfides, such as dithiobenzoylsulfide and dibenzyltetrasulfide; unsaturated compounds, such as 1,1-diphenylethylene and α-methylthioacrylonitrile; thiazines, such as Thionine Blue, toluidine blue and methylene blue; and stable radicals, such as 1,1-diphenyl-2-picrylhydrazyl, 1,3,5-triphenylpherdazyl, 4-hydroxy-2,2,6,6,-tetramethylpiperidine-1-oxyl, and 2,6-di-t-butyl-α-(3,5-di-t-butyl)-4-oxo-2,5-cyclohexadien-1-ylidene-p-trioxyl.

The thermal addition polymerization inhibitors may be used either singly or as a mixture of two or more of them together.

The amount of the thermal addition polymerization inhibitors is preferably about 0.001–2.0% by weight of the total weight of the photo-polymerizable resin composition of the present invention.

Other additives which can be used in the compositions of the present invention include antioxidants, surfactants, fillers, reinforcing agents, plasticizers, antihalations and adhesion adjuvants.

The first to fourth compositions of the present invention can be prepared, for example, by thoroughly blending component (1), component (2-1) to (2-4), component (3), component (4), and component (5), together with other additives which are optionally added, preferably under heating using a kneader or an inter mixer. It is possible to freely adjust the properties of the resulting compositions, such that they may be wax-like products, rubber-like products, or low-viscosity liquid products having good fluidity. The degree of fluidity of the composition can be suitably selected depending on the use to which it is directed. When a particularly low-viscosity composition is desired, an appropriate amount of a suitable solvent may be added.

The first to fourth compositions of the present invention are useful as materials for producing photo-sensitive resin plates.

Various methods can be employed to prepare photo-sensitive resin plates from these compositions depending on the degree of fluidity of the composition.

For example, when the composition has little fluidity or a low viscosity, it can be processed into a film having a desired thickness by passing it through spacers placed a suitable distance from each other, by applying it to a suitable supporting member using an applicator, such as a roll coater, or by molding by a suitable molding method, such as extrusion molding, calendar molding, or press molding.

A composition having good fluidity can be applied to a suitable supporting member using appropriate coating methods, such as roll coating, calendar coating, doctor blade coating or air-knife coating. Such a composition is particularly useful as a resist for use in spincoat.

These photo-sensitive resin plates and resists are exposed to light, for example, through a desired pattern or a negative film, by radiation with ultraviolet rays or chemically active lights. The parts on the plates or resists which have not been exposed to light are washed with water to remove the resin. The plates or resists are then dried to obtain distinct relief images. The plates or resists may then be re-exposed to light after they have been dried. Although the first to fourth compositions of the present invention are water-developable, they may alternatively be developed using an alkaline solution, if desired.

Having generally described this invention, a further understanding can be obtained by reference to certain specific examples which are provided herein for purposes of illustration only and are not intended to be limiting unless otherwise specified. In the Examples below, "part(s)" means "part(s) by weight".

EXAMPLES

Example 1

Component (1)

A monomer mixture of butadiene, methacrylic acid, ethylene glycol methacrylate, and ethyl acrylate at a mol percent ratio of 84.1:2.2:1.2:12.5 was polymerized at 65° C. for 10 hours using sodium lauryl sulfate as an emulsifier and 2,2'-azobisisobutylonitrile as a polymerization initiator. The polymerization conversion rate was 95%. After the polymerization, the produced emulsion was salted out and coagulated with calcium chloride, washed with water, and dried to obtain particles (average particle diameter: 710 nm) of component (1).

Component (2-1)

A polybutadiene monomer having hydroxy groups at both terminals (Mn=4,000) was obtained by polymerization of butadiene using hydrogen peroxide as a polymerization initiator and isopropanol as a polymerization solvent. The polybutadiene was reacted with tolylene diisocyanate to obtain a polymer having isocyanate groups at both terminals. The resulting polymer was then reacted with 2-hydroxyethyl methacrylate, taking care so that the polymer was not exposed to light during the polymerization, thus obtaining component (2-1) having methacryloyl groups via urethane bonds at both terminals of the molecular chain.

Photo-sensitive resin composition 100 parts of said component (1) above, 10 parts of component (2-1) above, 10 parts of nonaethylene glycol monomethacrylate and 10 parts of trimethylolpropane trimethacrylate as component (3), 10 parts of N-(3-dimethylaminopropyl)acrylamide as component (4), 3 parts of 2,2-dimethoxyphenylacetophenone as component (5), and 0.5 part of p-t-butylcatechol as a storage stabilizer were stirred for 30 minutes at 50° C. in a kneader to obtain a photo-sensitive resin composition. The resulting composition was a transparent wax.

Evaluation

A resin layer with a thickness of 0.5 mm was produced, from the photo-sensitive resin composition prepared above, on a polyester sheet. This resin layer was used as the photo-sensitive resin plate for the evaluation.

The aqueous developing capability of the photo-sensitive resin plate was evaluated by flushing it with hot water at 30° C. using a developer, JOW-A-4P (trademark, manufactured by Japan Electronic Equipment Co.), and measuring the period of time required for the resin layer to completely dissolve (such a period of time is hereafter referred to as the dissolution time).

The photo-sensitive resin plate was exposed to light for 6 minutes using a developer, JE-A-SS (trademark, manufactured by Japan Electronic Equipment Co.), and its tensile strength, elongation at break, and impact resilience were measured by methods conforming to JIS K6301.

As a result, the composition was found to have excellent water-developability and produced a resin plate possessing excellent strength, elongation at break, and impact resilience. The resin plate also had superb transparency. Thus, the resin composition can be judged to have an excellent characteristic balance.

The results of the valuation are given in Table 1.

Example 2

Component (1)

Polymer particles (average particle diameter: 700 nm) of component (1) were prepared by polymerization of butadiene, methacrylic acid, divinylbenzene, and methyl methacrylate, at a mol percent ratio of 84.1:2.2:1.2:12.5 in the same manner as in Example 1.

Component (2-1)

Tetrahydrofuran was polymerized in the presence of a polymerization initiator consisting of hydroperchloric acid and acetic acid anhydride. The polymer was neutralized, hydrolyzed, and purified to obtain polyether diol (Mn=2,000). Tolylene diisocyanate (TDI) and 2-hydroxyethyl methacrylate (2-HEM) were successively reacted with the polyether diol to obtain component (2-1), which is a polymer having methacryloyl groups via urethane bonds at both terminals of the molecular chain.

Photo-sensitive resin composition and evaluation

A photo-sensitive resin composition was prepared in the same manner as in Example 1, except for using component (1) and component (2-1) prepared above in this example. The evaluation of the resin composition was also carried out in the same manner as in Example 1.

The resulting composition was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 1.

Example 3

Preparation of component (1), component (2-1) (Mn=2,100), and a photo-sensitive resin composition was carried out in the same manner as in Example 2, except that a mixture of tetrahydrofuran and 3-methyltetrahydrofuran was used for the preparation of component (2-1). The evaluation of the resin composition was carried out in the same manner as in Example 1.

The resulting composition was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 1.

Example 4

Preparation of component (1), component (2-1) (Mn=4,000), and a photo-sensitive resin composition was carried out in the same manner as in Example 1, except that monomer mixtures shown in Table 1 were used for the preparation of component (1) and component (2-1) respectively. The resin composition was evaluated in the same manner as in Example 1.

As a result, the composition of this Example was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 1.

Example 5

Preparation of component (1), component (2-1) (Mn=4,200), and a photo-sensitive resin composition was carried out in the same manner as in Example 1, except that monomer mixtures shown in Table 1 were used for the preparation of component (2-1). The resin composition was evaluated in the same manner as in Example 1.

The resulting composition was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 1.

Example 6

A photo-sensitive resin composition was prepared in the same manner as in Example 1, except that 15 parts of 2-diethylaminoethyl methacrylate were used instead of 10 parts of N-(3-dimethylaminopropyl)acrylamide as component (4). The resin composition was evaluated in the same manner as in Example 1.

The composition of this Example was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 1.

Example 7

A photo-sensitive resin composition was prepared in the same manner as in Example 1, except that 10 parts of triethanolamine were used instead of 10 parts of N-(3-dimethylaminopropyl)acrylamide as component (4). The resin composition was evaluated in the same manner as in Example 1.

The composition of this Example was also found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 1.

TABLE 1

| Photo-sensitive resin composition | Example | | | | | | |
|---|---|---|---|---|---|---|---|
|  | 1 | 2 | 3 | 4 | 5 | 6 | 7 |
| Component (1) (part) | 100 | 100 | 100 | 100 | 100 | 100 | 100 |
| (Monomer composition (mol %)) | | | | | | | |
| (1) Butadiene | 84.1 | 84.1 | 84.1 | 84.1 | 84.1 | 84.1 | 84.1 |
| (2) Methacrylic acid | 2.2 | 2.2 | 2.2 | 2.2 | 2.2 | 2.2 | 2.2 |
| (3) Ethylene glycol dimethacrylate | 1.2 | — | — | — | 1.2 | 1.2 | 1.2 |
| Divinylbenzene | — | 1.2 | 1.2 | 1.2 | — | — | — |
| (4) Ethyl acrylate | 12.5 | — | — | — | 12.5 | 12.5 | 12.5 |
| Methyl methacrylate | — | 12.5 | 12.5 | 12.5 | — | — | — |
| Component (2-1) (part) | 10 | 10 | 10 | 30 | 10 | 10 | 10 |
| (Monomer composition (mol %)) | | | | | | | |
| Butadiene | 100 | — | — | 100 | 80.0 | 100 | 100 |
| Styrene | — | — | — | — | 20.0 | — | — |
| Tetrahydrofuran | — | 100 | 55.0 | — | — | — | — |
| 3-Methyltetrahydrofuran | — | — | 45.0 | — | — | — | — |
| Mn ($\times 10^3$) | 4.0 | 2.0 | 2.1 | 4.0 | 4.2 | 4.0 | 4.0 |
| Complementary unsaturated compounds (part) | | | | | | | |
| 2-Hydroxyethyl methacrylate | 7.5 | 15 | 16 | 7.5 | 7.1 | 7.5 | 7.5 |
| Glycidyl methacrylate | — | — | — | — | — | — | — |
| 2-HEM/TDI addition compound | — | — | — | — | — | — | — |
| CAM/TDI addition compound | — | — | — | — | — | — | — |
| Component (3) (part) | | | | | | | |
| Nonaethylene glycol monomethacrylate | 10 | 10 | 10 | 10 | 10 | 10 | 10 |
| Trimethylolpropane trimethacrylate | 10 | 10 | 10 | 10 | 10 | 10 | 10 |
| Component (4) (part) | | | | | | | |
| N-(3-dimethylaminopropyl)acrylamide | 10 | 10 | 10 | 10 | 10 | — | — |

TABLE 1-continued

| Photo-sensitive resin composition | Example | | | | | | |
|---|---|---|---|---|---|---|---|
| | 1 | 2 | 3 | 4 | 5 | 6 | 7 |
| 2-Diethylaminoethyl methacrylate | — | — | — | — | — | 15 | — |
| Triethanolamine | — | — | — | — | — | — | 10 |
| Component (5) (part) | | | | | | | |
| 2,2-Dimethoxyphenylacetophenone | 3 | 3 | 3 | 3 | 3 | 3 | 3 |
| Other component (part) | | | | | | | |
| p-t-Butylcatechol | 0.5 | 0.5 | 0.5 | 0.5 | 0.5 | 0.5 | 0.5 |
| Evaluation | | | | | | | |
| Dissolution time (second) | 60 | 70 | 70 | 75 | 90 | 63 | 55 |
| Tensile strength (kgf/cm$^2$) | 38 | 35 | 34 | 43 | 58 | 42 | 37 |
| Elongation at break (%) | 75 | 70 | 70 | 85 | 100 | 75 | 70 |
| Impact resilience | 33 | 32 | 32 | 34 | 35 | 33 | 33 |

Example 8

A photo-sensitive resin composition was prepared in the same manner as in Example 1, except that 10 parts of component (2-2) prepared by the method described below and 10 parts of triethanolamine were used as component (4). The resin composition was evaluated in the same manner as in Example 1.

Component (2-2)

4 parts of maleic acid was added to a toluene solution containing 100 parts (as solid) of component (2-1) prepared in the same manner as in Example 1 and reacted at 100° C. to obtain component (2-2) having photo-polymerizable unsaturated groups at the terminals of the molecular chain and side chains.

The resulting composition was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 2.

Example 9

Component (1)

A monomer mixture of butadiene, methacrylic acid, ethylene glycol dimethacrylate, and methyl methacrylate at a mol percent ratio of 80.0:6.5:1.0:12.5 was polymerized at 65° C. for 10 hours using sodium lauryl sulfate as an emulsifier and potassium persulfate as a polymerization initiator. The polymerization conversion rate was 96%. After the polymerization, the produced emulsion was salted out and coagulated with calcium chloride, washed with water, and dried to obtain particles (average particle diameter: 720 nm) of component (1).

Component (2-3)

A copolymer containing a hydroxy group (Mn=3,700) was prepared by the polymerization of a monomer mixture of butyl acrylate, methacrylic acid, and 2-HEM at a mol percent ratio of 70.0:20.0:10.0 at 70° C. for 6 hours using benzoyl peroxide as a polymerization initiator and toluene as a polymerization solvent. The polymerization conversion rate was 94%.

Separately, equivalent molar amounts of cinnamyl alcohol (CMA) and TDI were reacted, taking care so that the mixture was not exposed to light during the polymerization, to provide a cinnamic acid ester containing an isocyanate group (CMA/TDI addition compound).

Component (2-3) having cinnamoyl groups via urethane bonds in the molecular side chain was obtained by reacting 100 parts of the copolymer containing a hydroxy group and 4.4 parts of the CMA/TDI addition compound in the presence of a catalytic amount of di-n-butyltin dilaurate.

Photo-sensitive resin composition 100 parts of component (1), 10 parts of component (2-3), 10 parts of nonaethylene glycol monomethacrylate and 10 parts of trimethylolpropane trimethacrylate as component (3), 10 parts of N-(3-dimethylaminopropyl)-acrylamide as component (4), 3 parts of 2,2-dimethoxyphenylacetophenone as component (5), and 0.5 part of p-t-butylcatecol as a storage stabilizer were stirred for 30 minutes at 50° C. in a kneader to obtain a photo-sensitive resin composition. The resulting composition was a transparent wax.

Evaluation

Photo-sensitive resin plates were prepared in the same manner as in Example 1 from the photo-sensitive resin composition of this Example. The dissolution time, tensile strength, elongation at break, and impact resilience of the plates were measured by the same methods as in Example 1.

As a result, the composition was found to have excellent water-developability and to produce a resin plate possessing excellent strength, elongation at break, and impact resilience. The resin plate also had superb transparency. Thus, the resin composition can be judged to have an excellent characteristic balance.

The results of the valuation are given in Table 2.

Example 10

A photo-sensitive resin composition was prepared in the same manner as in Example 9, except that component (2-3) prepared by the method described below and 2-diethylaminoethylmethacylate were used as component (4). The resin composition was evaluated in the same manner as in Example 9.

Component (2-3)

Equivalent molar amounts of 2-HEM and TDI were reacted, taking care so that the mixture was not exposed to light during the polymerization, to obtain a methacrylic acid ester containing an isocyanate group (2-HEM/TDI addition compound). Component (2-3) having methacryloyl groups via urethane bonds in the molecular side chain was obtained by reacting 100 parts of the copolymer (Mn=3,700) containing a hydroxy group prepared in Example 9 and 8.8 parts of the 2-HEM/TDI addition compound in the presence of a catalytic amount of di-n-butyltin dilaurate.

The composition of this Example was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 2.

TABLE 2

| Photo-sensitive resin composition | Example | | |
|---|---|---|---|
| | 8 | 9 | 10 |
| Component (1) part | 100 | 100 | 100 |
| (Monomer composition (mol %)) | | | |
| (1) Butadiene | 84.1 | 80.0 | 80.0 |
| (2) Methacrylic acid | 2.2 | 6.5 | 6.5 |
| (3) Ethylene glycol dimethacrylate | 1.2 | 1.0 | 1.0 |
| Divinylbenzene | — | — | — |
| (4) Ethyl acrylate | 12.5 | — | — |
| Methyl methacrylate | — | 12.5 | 12.5 |
| Components (2-2) or (2-3) (part) | 10 | 10 | 10 |
| (Monomer composition (mol %)) | (*1) | | |
| Butadiene | 100 | — | — |
| Butyl acrylate | — | 70.0 | 70.0 |
| Methacrylic acid | —20.0 | 20.0 | |
| 2-HEM | — | 10.0 | 10.0 |
| Mn (×10³) | 4.0 | 3.7 | 3.7 |
| Complementary unsaturated compounds (part) | | | |
| 2-Hydroxyethyl monomethacrylate | 7.5 | — | — |
| Glycidyl methacrylate | — | — | — |
| 2-HEM/TDI addition compound | — | — | 8.8 |
| CAM/TDI addition compound | — | 4.4 | — |
| Component (3) (part) | | | |
| Nonaethylene glycol monomethacrylate | 10 | 10 | 10 |
| Trimethylolpropane trimethacrylate | 10 | 10 | 10 |
| Component (4) (part) | | | |
| N-(3-dimethylaminopropyl)acrylamide | — | 10 | — |
| 2-Diethylaminoethyl methacrylate | — | — | 10 |
| Triethanolamine | 10 | — | — |
| Component (5) (part) | | | |
| 2,2-Dimethoxyphenylacetophenone | 3 | 3 | 3 |
| Other component (part) | | | |
| p-t-Butylcatechol | 0.5 | 0.5 | 0.5 |
| Evaluation | | | |
| Dissolution time (second) | 58 | 64 | 68 |
| Tensile strength (kgf/cm²) | 48 | 43 | 49 |
| Elongation at break (%) | 75 | 65 | 75 |
| Impact resilience | 34 | 33 | 35 |

(*1) Maleic acid anhydride addition compound

Example 11

A photo-sensitive resin composition was prepared in the same manner as in Example 9, except that component (2-3) prepared by the method described below was used. The resin composition was evaluated in the same manner as in Example 9.
Component (2-3)

Component (2-3) having carboxyl groups in the molecular side chains (Mn=3,800) was prepared by the polymerization of a monomer mixture of butyl acrylate and methacrylic acid at a mol percent ratio of 80:20 at 65° C. for 8 hours using 2,2'-azobisisobutylonitrile as a polymerization initiator and toluene as a polymerization solvent. The polymerization conversion rate was 97%.

The resulting composition was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 3.

Example 12

A photo-sensitive resin composition was prepared in the same manner as in Example 9, except that component (2-3) prepared by the method described below was used. The resin composition was evaluated in the same manner as in Example 9.
Component (2-3)

Component (2-3) having carboxyl groups in the molecular side chains (Mn=4,000) was prepared by the polymerization of a monomer mixture consisting of ethyl acrylate, acrylonitrile, and acrylic acid at a mol percent ratio of 70:20:10 at 65° C. for 8 hours using 2,2'-azobisisobutylonitrile as a polymerization initiator and toluene as a polymerization solvent. The polymerization conversion rate was 97%.

The composition of this Example was found to have excellent water-developing ability and to produce a resin plate possessing excellent strength, elongation at break, and impact resilience, as well as superb transparency. Thus, the resin composition was judged to have an excellent characteristic balance.

The results of the valuation are shown in Table 3.

Example 13

A photo-sensitive resin composition was prepared in the same manner as in Example 9, except that component (2-3) was prepared by the method described below, and 10 parts of trimethylolpropane trimethacrylate and 10 parts of acrylic acid, were used as component (3). The resin composition was evaluated in the same manner as in Example 9.
Component (2-3)

Component (2-3) having amino groups in the molecular side chains (Mn=3,600) was prepared by the polymerization of a monomer mixture consisting of ethyl acrylate, acrylonitrile, and 2-diethylamino methacrylate at a mol percent ratio of 75:10:15 at 65° C. for 8 hours using 2,2'-azobisisobutylonitrile as a polymerization initiator and toluene as a polymerization solvent. The polymerization conversion rate was 95%.

The resulting composition of this Example was found to have excellent water-developing ability and to produce a resin plate possessing excellent strength, elongation at break, and impact resilience, as well as superb transparency. Thus, the resin composition was judged to have an excellent characteristic balance.

The results of the valuation are shown in Table 3.

Example 14

A photo-sensitive resin composition was prepared in the same manner as in Example 9, except that component (2-3) prepared by the method described below was used. The resin composition was evaluated in the same manner as in Example 9.
Component (2-3)

A component (2-3) having epoxy groups and hydroxy groups in the molecular side chains (Mn=3,800) was prepared by the polymerization of a monomer mixture consisting of butyl acrylate, glycidyl methacrylate, and 2-HEM at a mol percent ratio of 70:20:10 at 65° C. for 8 hours using 2,2'-azobisisobutylonitrile as a polymerization initiator and toluene as a polymerization solvent. The polymerization conversion rate was 97%.

As a result, the composition was found to have excellent water-developing ability and to produce a resin plate possessing excellent strength, elongation at break, and impact resilience, as well as superb transparency. Thus, the resin composition was judged to have an excellent characteristic balance.

The results of the valuation are shown in Table 3.

TABLE 3

| Photo-sensitive resin composition | Example | | | |
|---|---|---|---|---|
| | 11 | 12 | 13 | 14 |
| Component (1) part | 100 | 100 | 100 | 100 |
| (Monomer composition (mol %)) | | | | |
| (1) Butadiene | 84.1 | 84.1 | 84.1 | 84.1 |
| (2) Methacrylic acid | 2.2 | 2.2 | 2.2 | 2.2 |
| (3) Ethylene glycol dimethacrylate | 1.2 | — | — | — |
| Divinylbenzene | — | 1.2 | 1.2 | 1.2 |
| (4) Ethyl acrylate | 12.5 | — | — | — |
| Methyl methacrylate | — | 12.5 | 12.5 | 12.5 |
| Components (2-3) (part) | 10 | 10 | 10 | 30 |
| (Monomer composition (mol %)) | | | | |
| Butyl acrylate | 80 | — | — | 70 |
| Ethyl acrylate | — | 70 | 75 | — |
| Acrylonitrile | — | 20 | 10 | — |
| 2-Diethylaminoethyl methacrylate | 20 | — | — | — |
| Glycidyl methacrylate | — | — | — | 20 |
| 2-HEM | — | — | — | 10 |
| Mn (×10³) | 3.8 | 4.0 | 3.6 | 3.8 |
| Component (3) (part) | | | | |
| Nonaethylene glycol monomethacrylate | 10 | 10 | 10 | 10 |
| Trimethylolpropane trimethacrylate | 10 | 10 | 10 | 10 |
| Acrylic acid | — | — | 10 | — |
| Component (4) (part) | | | | |
| N-(3-dimethylaminopropyl)acrylamide | 10 | 10 | 10 | 10 |
| 2-Diethylaminoethyl methacrylate | — | — | — | — |
| Triethanolamine | — | — | — | — |
| Component (5) (part) | | | | |
| 2.2-Dimethoxyphenylacetophenone | 3 | 3 | 3 | 3 |
| Other component (part) | | | | |
| p-t-Butylcatechol | 0.5 | 0.5 | 0.5 | 0.5 |
| Evaluation | | | | |
| Dissolution time (second) | 52 | 62 | 54 | 65 |
| Tensile strength (kgf/cm²) | 42 | 54 | 55 | 41 |
| Elongation at break (%) | 70 | 65 | 65 | 60 |
| Impact resilience | 34 | 34 | 32 | 33 |

Example 15

Component (1)

A monomer mixture of butadiene, methacrylic acid, divinylbenzene, and methyl methacrylate at a mol percent ratio of 80.0:6.5:1.0:12.5 was polymerized at 65° C. for 10 hours using sodium lauryl sulfate as an emulsifier and potassium persulfate as a polymerization initiator. The polymerization conversion rate was 94%. After the polymerization, the produced emulsion was salted out and coagulated with calcium chloride, washed with water, and dried to obtain particles (average particle diameter: 700 nm) of component (1).

Component (2-4)

A copolymer containing a carboxy group (Mn=3,500) was prepared by the polymerization of a monomer mixture of butadiene and methacrylic acid at a mol percent ratio of 90.0:10.0 at 70° C. for 6 hours using benzoyl peroxide as a polymerization initiator and toluene as a polymerization solvent. The polymerization conversion rate was 97%. 2 parts of glycidyl methacrylate was added to 100 parts of this copolymer and the mixture was reacted in the presence of a catalytic amount of tetra-n-butylammonium bromide, thus obtaining component (2-4) having methacryloyl groups via ester bonds in the molecular side chains.

Photo-sensitive resin composition 100 parts of component (1), 10 parts of component (2-4), 10 parts of nonaethylene glycol monomethacrylate and 10 parts of trimethylolpropane trimethacrylate as component (3), 10 parts of N-(3-dimethylaminopropyl)-acrylamide as component (4), 3 parts of 2.2-dimethoxyphenylacetophenone as component (5), and 0.5 part of p-t-butylcatecol as a storage stabilizer were stirred for 30 minutes at 50° C. in a kneader to obtain a photo-sensitive resin composition. The resulting composition was a transparent wax.

Evaluation

Photo-sensitive resin plates were prepared in the same manner as in Example 1 from the photo-sensitive resin composition prepared above. The dissolution time, tensile strength, elongation at break, and impact resilience of the plates were measured by the same methods as in Example 1.

As a result, the composition was found to have excellent water-developability and to produce a resin plate possessing excellent strength, elongation at break, and impact resilience. The resin plate also had superb transparency. Thus, the resin composition can be judged to have an excellent characteristic balance.

The results of the valuation are given in Table 4.

Example 16

Preparation of component (1), component (2-4) (Mn=3,500), and a photo-sensitive resin composition was carried out in the same manner as in Example 15, except a copolymer having a monomer composition shown in Table 3 was used as the copolymer having carboxyl groups of component (2-4). The evaluation of the resin composition was carried out in the same manner as in Example 1.

As a result, this composition was found to have excellent water-developability and to produce a resin plate possessing excellent strength, elongation at break, and impact resilience, as well as superb transparency. Thus, the resin composition was judged to have an excellent characteristic balance.

The results of the valuation are shown in Table 4.

Example 17

Component (1)

Polymer particles (average particle diameter: 720 nm) prepared in Example 9 were used as component (1).

Component (2-4)

A copolymer containing a hydroxy group (Mn=3,600) was prepared by the polymerization of a monomer mixture consisting of butadiene, acrylonitrile, methacrylic acid, and 2-HEM at a mol percent ratio of 58.0:30.0:10.0:2.0 under the same conditions as in Example 15.

Separately, equivalent molar amounts of 2-HEM and TDI were reacted, taking care so that the mixture was not exposed to light during the reaction, thus obtaining methacrylic acid ester containing an isocyanate group (2-HEM/TDI addition compound).

Component (2-4) having methacryloyl groups via urethane bonds in the molecular side chains was obtained by reacting 100 parts of the copolymer containing a hydroxy group and 4.4 parts of the 2-HEM/TDI addition compound in the presence of a catalytic amount of di-n-butyltin dilaurate.

Photo-sensitive resin composition

A photo-sensitive resin composition was prepared in the same manner as in Example 15 except for using component (1) and component (2-4) prepared above in this Example, and evaluated in the same manner as in Example 15.

As a result, the composition was found to have excellent water-developability and to produce a resin plate possessing excellent strength, elongation at break, and impact resilience. The resin plate also had superb transparency. Thus, the resin composition can be judged to have an excellent characteristic balance.

The results of the valuation are given in Table 4.

Example 18

A photo-sensitive resin composition was prepared in the same manner as in Example 15, except that component (2-4) prepared by the method described below was used. The resin composition was evaluated in the same manner as in Example 18.
Component (2-4)

Component (2-4) was an ester containing an unsaturated group made from 1.6 mol of maleic acid anhydride added to 1 mol of polybutadiene (Mn=1.000) (MM-1000-80: trademark, manufactured by Nippon Petrochemical Co., Ltd.)

The composition of this Example was found to have excellent water-developing ability and to produce a resin plate possessing excellent strength, elongation at break, and impact resilience, as well as superb transparency. Thus, the resin composition was judged to have an excellent characteristic balance.

The results of the valuation are shown in Table 4.

Example 19

A photo-sensitive resin composition was prepared in the same manner as in Example 15, except that component (2-4) prepared by the method described below was used. The resin composition was evaluated in the same manner as in Example 18.
Component (2-4)

A monomer mixture consisting of butadiene, acrylonitrile, and methacrylic acid at a mol percent ratio of 60.0:30.0:10.0 was polymerized at 70° C. for 7 hours to obtain component (2-4) (Mn=3,500). The polymerization conversion rate was 95%.

As a result, the composition was found to have excellent water-developing ability and to produce a resin plate possessing excellent strength, elongation at break, and impact resilience, as well as superb transparency. Thus, the resin composition was judged to have an excellent characteristic balance.

The results of the valuation are shown in Table 4.

TABLE 4

| Photo-sensitive resin composition | Example | | | | |
|---|---|---|---|---|---|
| | 15 | 16 | 17 | 18 | 19 |
| Component (1) part | 100 | 100 | 100 | 100 | 100 |
| (Monomer composition (mol %)) | | | | | |
| (1) Butadiene | 80.0 | 80.0 | 80.0 | 80.0 | 80.0 |
| (2) Methacrylic acid | 6.5 | 6.5 | 6.5 | 6.5 | 6.5 |
| (3) Ethylene glycol dimethacrylate | — | — | 1.0 | — | — |
| Divinylbenzene | 1.0 | 1.0 | — | 1.0 | 1.0 |
| (4) Ethyl acrylate | — | — | — | — | — |
| Methyl methacrylate | 12.5 | 12.5 | 12.5 | 12.5 | 12.5 |
| Components (2-3) (part) | 10 | 10 | 10 | 10 | 10 |
| (Monomer composition (mol %)) | | | | | (*2) |
| Butadiene | 90.0 | 60.0 | 58.0 | 100 | 60.0 |
| Acrylonitrile | — | 30.0 | 30.0 | — | 30.0 |
| Methacrylic acid | 10.0 | 10.0 | 10.0 | — | 10.0 |
| 2-HEM | — | — | 2.0 | — | — |
| 2-Diethylaminoethyl methacrylate | — | — | — | — | — |
| Glycidyl methacrylate | — | — | — | — | — |
| Mn (×10³) | 3.5 | 3.5 | 3.6 | 1.0 | 3.5 |
| Complementary unsaturated compounds (part) | | | | | |
| 2-Hydroxyethyl methacrylate | — | — | — | — | — |
| Glycidyl methacrylate | 2 | 2 | — | — | — |
| 2-HEM/TDI addition compound | — | — | 4.4 | — | — |
| CAM/TDI addition compound | — | — | — | — | — |
| Component (3) (part) | | | | | |
| Nonaethylene glycol methacrylate | 10 | 10 | 10 | 10 | 10 |
| Trimethylolpropane trimethacrylate | 10 | 10 | 10 | 10 | 10 |
| Component (4) (part) | | | | | |
| N-(3-dimethylaminopropyl)acrylamide | 10 | 10 | 10 | 10 | 10 |
| 2-Diethylaminoethyl methacrylate | — | — | — | — | — |
| Triethanolamine | — | — | — | — | — |
| Component (5) (part) | | | | | |
| 2,2-Dimethoxyphenylacetophenone | 3 | 3 | 3 | 3 | 3 |
| Other component (part) | | | | | |
| p-t-Butylcatechol | 0.5 | 0.5 | 0.5 | 0.5 | 0.5 |
| Evaluation | | | | | |
| Dissolution time (second) | 60 | 63 | 62 | 60 | 60 |
| Tensile strength (kgf/cm²) | 49 | 62 | 61 | 48 | 55 |

TABLE 4-continued

|  | Example | | | | |
|---|---|---|---|---|---|
| Photo-sensitive resin composition | 15 | 16 | 17 | 18 | 19 |
| Elongation at break (%) | 70 | 75 | 75 | 70 | 70 |
| Impact resilience | 35 | 34 | 34 | 35 | 34 |

(*2) Ester containing unsaturated group of maleic acid addition compound of polybutadiene (MM1000-80: trademark, manufactured by Nippon Petrochemical Co., Ltd.)

Example 20

A photo-sensitive resin composition was prepared in the same manner as in Example 15, except that component (2-4) prepared by the method described below was used. The resin composition was evaluated in the same manner as in Example 15.

Component (2-4)

Component (2-4) was an addition compound of 1.6 mol of maleic acid anhydride and 1 mol of polybutadiene (Mn=1,000) (M1000-80: trademark, manufactured by Nippon Petrochemical Co., Ltd.)

The resulting composition was found to have excellent water-developing ability and to produce a resin plate possessing excellent strength, elongation at break, and impact resilience, as well as superb transparency. Thus, the resin composition was judged to have an excellent characteristic balance.

The results of the valuation are shown in Table 5.

Examples 21–23

Photo-sensitive resin compositions were prepared in the same manner as in Example 15, except that copolymers prepared from monomer mixtures shown in Table 5 were used as components (2-4). The resin compositions were evaluated in the same manner as in Example 15.

As a result, the composition of Examples 21–23 were found to have excellent water-developing ability and to produce resin plates possessing excellent strength, elongation at break, and impact resilience, as well as superb transparency. Thus, they were judged to have an excellent characteristic balance.

The results of the valuation are shown in Table 5.

TABLE 5

|  | Example | | | |
|---|---|---|---|---|
| Photo-sensitive resin composition | 20 | 21 | 22 | 23 |
| Component (1) part | 100 | 100 | 100 | 100 |
| (Monomer composition (mol %)) | | | | |
| (1) Butadiene | 80.0 | 80.0 | 80.0 | 80.0 |
| (2) Methacrylic acid | 6.5 | 6.5 | 6.5 | 6.5 |
| (3) Ethylene glycol dimethacrylate | — | — | — | — |
| Divinylbenzene | 1.0 | 1.0 | 1.0 | 1.0 |
| (4) Ethyl acrylate | — | — | — | — |
| Methyl methacrylate | 12.5 | 12.5 | 12.5 | 12.5 |
| Components (2-4) (part) | 10 | 10 | 10 | 10 |
| (Monomer composition (mol %)) | (*3) | | | |
| Butadiene | 100 | 60.0 | 60.0 | 60.0 |
| Acrylonitrile | — | 30.0 | 30.0 | 30.0 |
| Methacrylic acid | — | — | — | — |
| 2-HEM | — | 10.0 | — | — |
| 2-Diethylaminoethyl methacrylate | — | — | 10.0 | — |
| Glycidyl methacrylate | — | — | — | 10.0 |
| Mn (×10³) | 1.0 | 3.4 | 3.5 | 3.7 |
| Complementary unsaturated compounds | | | | |

TABLE 5-continued

|  | Example | | | |
|---|---|---|---|---|
| Photo-sensitive resin composition | 20 | 21 | 22 | 23 |
| (part) | | | | |
| 2-Hydroxyethyl methacrylate | — | — | — | — |
| Glycidyl methacrylate | — | — | — | — |
| 2-HEM/TDI addition compound | — | — | — | — |
| CAM/TDI addition compound | — | — | — | — |
| Component (3) (part) | | | | |
| Nonaethylene glycol monomethacrylate | 10 | 10 | 10 | 10 |
| Trimethylolpropane trimethacrylate | 10 | 10 | 10 | 10 |
| Component (4) (part) | | | | |
| N-(3-dimethylaminopropyl)acrylamide | 10 | 10 | 10 | 10 |
| Component (5) (part) | | | | |
| 2,2-Dimethyoxyphenylacetophenone | 3 | 3 | 3 | 3 |
| Other component (part) | | | | |
| p-t-Butylcatechol | 0.5 | 0.5 | 0.5 | 0.5 |
| Evaluation | | | | |
| Dissolution time (second) | 59 | 58 | 62 | 64 |
| Tensile strength (kgf/cm²) | 39 | 42 | 59 | 43 |
| Elongation at break (%) | 65 | 65 | 75 | 65 |
| Impact resilience | 34 | 33 | 33 | 35 |

(*3) Maleic acid anhydride addition compound of polybutadiene (MM1000-80: trademark, manufactured by Nippon Petrochemical Co., Ltd.)

Comparative Example 1

A photo-sensitive resin composition was prepared in the same manner as in Example 1, except that the addition of component (2-1) was omitted. The resin composition was evaluated in the same manner as in Example 1.

As a result, the composition was found to produce a resin plate possessing insufficient strength, elongation at break, and poor impact resilience, although it exhibited excellent water-developing ability.

The results of the valuation are shown in Table 6.

Comparative Example 2

A photo-sensitive resin composition was prepared in the same manner as in Example 1, except that 30 parts of styrene-butadiene-styrene block copolymer (Mn=70,000) (JSR TR 2000: trademark, manufactured by Japan Synthetic Rubber Co., Ltd.) was used instead of component (2-1). The resin composition was evaluated in the same manner as in Example 1.

As a result, this composition was found to exhibit remarkably poor water-developing capability.

The results of the valuation are shown in Table 6.

Comparative Example 3

A photo-sensitive resin composition was prepared in the same manner as in Example 10, except that a butadiene-acrylonitrile (83.0:17.0 mol %) copolymer containing carboxyl groups at both terminals of the molecular chain (Hycar CTBN1300x8: trademark, manufactured by B. F. Goodrich Co.) was used instead of component (2-4). The resin composition was evaluated in the same manner as in Example 10.

As a result, the composition was found to produce a resin plate possessing insufficient strength, elongation at break, and poor impact resilience, although it exhibited excellent water-developing ability.

The results of the valuation are shown in Table 6.

TABLE 6

| Photo-sensitive resin composition | Comparative Example | | |
|---|---|---|---|
| | 1 | 2 | 3 |
| Component (1) part | 100 | 100 | 100 |
| (Monomer composition (mol %)) | | | |
| (1) Butadiene | 84.1 | 84.1 | 84.1 |
| (2) Methacrylic acid | 2.2 | 2.2 | 6.5 |
| (3) Ethylene glycol dimethacrylate | 1.2 | 1.2 | — |
| Divinylbenzene | — | — | 1.0 |
| (4) Ethyl acrylate | 12.5 | 12.5 | — |
| Methyl methacrylate | — | — | 12.5 |
| Comparative polymer (part) | 0 | 30 | 10 |
| (Monomer composition (mol %)) | | (*4) | (*5) |
| Butadiene | — | 60 | 83 |
| Styrene | — | 40 | — |
| Acrylonitrile | — | — | 17 |
| Mn ($\times 10^3$) | — | 70.0 | 3.5 |
| Complementary unsaturated compounds (part) | | | |
| 2-Hydroxyethyl monomethacrylate | — | — | — |
| Glycidyl methacrylate | — | — | — |
| 2-HEM/TDI addition compound | — | — | — |
| CAM/TDI addition compound | — | — | — |
| Component (3) (part) | | | |
| Nonaethylene glycol methacrylate | 15 | 10 | 10 |
| Trimethylolpropane trimethacrylate | 15 | 10 | 10 |
| Component (4) (part) | | | |
| N-(3-dimethylaminopropyl)acrylamide | 10 | 10 | 10 |
| 2-Diethylaminoethyl methacrylate | — | — | — |
| Triethanolamine | — | — | — |
| Component (5) (part) | | | |
| 2,2-Dimethoxyphenylacetophenone | 3 | 3 | 3 |
| Other component (part) | | | |
| p-t-Butylcatechol | 0.5 | 0.5 | 0.5 |
| Evaluation | | | |
| Dissolution time (second) | 55 | 260 | 58 |
| Tensile strength (kgf/cm$^2$) | 29 | 65 | 31 |
| Elongation at break (%) | 55 | 80 | 50 |
| Impact resilience | 28 | 33 | 30 |

(*4) Styrene-butadiene-styrene block copolymer (JSR TR 2000: trademark, manufactured by Japan Synthetic Rubber Co., Ltd.)
(*5) Butadiene-acrylonitrile copolymer containing carboxy groups at both terminals (Hycar CTBN1300x8: trademark, manufactured by B. F. Goodrich Co.)

The photo-sensitive resin compositions of the present invention have excellent water-developing capability and produce resin plates possessing superior strength after exposure to light compared to conventional resin plates. In addition, the resin compositions possess excellent elongation at break and impact resilience, as well as superb transparency. Thus, they have an excellent characteristic balance. Furthermore, these compositions have excellent processability, since they may be made into a non-fluid, wax-like or rubber-like material, or a fluid, low-viscosity liquid by freely and readily adjusting the fluidity. The compositions therefore not only can be used as photo-sensitive resin plates in fields such as photoresists and book manufacture with extreme advantage, but also are useful as photo-sensitive inks, photo-sensitive paints, photo-sensitive adhesives, and optical molding materials.

Obviously, numerous modifications and variations of the present invention are possible in light of the above teachings. It is therefore to be understood that within the scope of the appended claims, the invention may be practiced otherwise than as specifically described herein.

What is claimed is:

1. A water-developable photo-sensitive resin composition consisting essentially of, (1) 100 parts by weight of a particulate polymer of a carboxy-group-containing-diene having a cross-linked structure and an average particle diameter of from 20–1,000 nm, which is prepared by emulsion or suspension polymerization of a monomer mixture, comprising (i) 10–95 mol % of at least one aliphatic conjugated diene monomer, (ii) 0.1–30 mol % of at least one unsaturated monomer containing a carboxyl group, (iii) 0.01–20 mol % of at least one monomer containing at least two polymerizable unsaturated groups, and (iv) 0–70 mol % of a further copolymerizable monomer or mixture of copolymerizable monomers, provided that the total of (i), (ii), (iii), and (iv) is 100 mol %.

(2) 0.1–30 parts by weight of an oligomer consisting of a polyetherdiol, having a (meth)acryloyl group via a urethane bond at both terminals of the molecular chain and having a number average molecular weight of from 2,000–5,000.

(3) 5–1,000 parts by weight of a photo-polymerizable unsaturated monomer, (4) a compound containing at least one primary, secondary or tertiary amino group in an amount of 0.1–5 mol for 1 mol of the carboxyl group present in said polymer (1), and (5) 0.1–20 parts by weight of a photo-polymerization initiator.

2. The water-developable photo-sensitive resin composition according to claim 1, wherein said copolymerizable monomer (iv) of polymer (1) is at least one monomer selected from the group consisting of aromatic vinyl compounds, unsaturated nitriles, (meth)acrylic acid esters, and methoxydialkylene glycol monoacrylates.

3. The water-developable photo-sensitive resin composition according to claim 1, wherein said particulate polymer of a carboxyl-group-containing-diene having a cross-linked structure (1) is a polymer prepared by emulsion polymerization of a monomer mixture comprising, (i) 10–95 mol % of at least one aliphatic conjugated diene monomer selected from the group consisting of 1,3-butadiene and isoprene, (ii) 0.1–30 mol % of at least one unsaturated monomer containing a carboxyl group selected from the group consisting of acrylic acid, methacrylic acid, crotonic acid, cinnamic acid, itaconic acid, maleic acid, and monoesters prepared by reaction of 2-hydroxyethyl (meth)acrylate with phthalic acid or succinic acid, (iii) 0.01–20 mol % of at least one monomer containing at least two polymerizable unsaturated groups selected from the group consisting of ethylene glycol di(meth)acrylate, propylene glycol di(meth)acrylate, divinylbenzene, hexanediol di(meth)acrylate, pentaerythritol tri(meth)acrylate, pentaerythritol tetra(meth)acrylate, and trimethylolpropane tri(meth)acrylate, and (iv) 0–70 mol % of a copolymerizable monomer selected from the group consisting of styrene, acrylonitrile, methyl (meth)acrylate, ethyl (meth)acrylate, 2-ethylhexyl (meth)acrylate, methoxyethyl acrylate, methoxy diethylene glycol monoacrylate, methoxy dipropylene glycol monoacrylate, and lauryl (meth)acrylate, provided that the total of (i), (ii), (iii), and (iv) is 100 mol %.

4. The water-developable photo-sensitive resin composition according to claim 1, wherein said photo-polymerizable unsaturated monomer (3) is one or more compounds having a molecular weight $\leq$ 1,000, having 1–4 (meth)acryloyl groups and no amino group.

5. The water-developable photo-sensitive resin composition according to claim 1, wherein said photo-polymerizable unsaturated monomer (3) is one or more compounds selected from the group consisting of nonaethylene glycol mono(meth)acrylate, lauryl (meth)acrylate, hexanediol (meth)acrylate, trimethylolpropane tri(meth)acrylate, and (meth)acrylic acid.

6. The water-developable photo-sensitive resin composition according to claim 1, wherein said compound containing an amino group (4) is one or more compounds selected from the group consisting of (meth)acrylates containing a tertiary amino group, (meth)acrylamides containing a tertiary amino group, trialkyl amines, alkyl alkanol tertiary amines, and trialkanol amines.

7. The water-developable photo-sensitive resin composition according to claim 1, wherein said compound containing an amino group (4) is one or more compounds selected from the group consisting of N-(3-dimethylaminopropyl) (meth)acrylamide, N-(2-dimethylaminopropyl) (meth)acrylamide, N-(2-dimethylaminoethyl) (meth)acrylamide, 2-diethylaminoethyl (meth)acrylate, 2-diethylaminopropyl (meth)acrylate, 2-dimethylamino-propyl (meth)acrylate, triethanolamine, and tributylamine.

8. The water-developable photo-sensitive resin composition according to claim 1, wherein said photo-polymerization initiator (5) is one or more compounds selected from the group consisting of 2,2-dimethoxyphenylacetophenone, benzoin methyl ether, 2-chloroxanthone, 2-chlorothioxanthone, and 2-ethylanthraquinone.

9. The water-developable photo-sensitive resin composition as claimed in claim 1, wherein said polyetherdiol of component (2) is prepared by polymerization of tetrahydrofuran.

10. A water-developable photo-sensitive resin plate prepared from the photo-sensitive resin composition of claim 1.

* * * * *

UNITED STATES PATENT AND TRADEMARK OFFICE
CERTIFICATE OF CORRECTION

PATENT NO. : 5,736,298
DATED : APRIL 7, 1998
INVENTOR(S) : KATSUO KOSHIMURA ET AL.

It is certified that error appears in the above-identified patent and that said Letters Patent is hereby corrected as shown below:

Column 42, line 13, "carboxy-" should read "carboxyl-".

Signed and Sealed this

Twenty-eighth Day of July, 1998

Attest:

BRUCE LEHMAN

Attesting Officer                Commissioner of Patents and Trademarks